United States Patent
McCullough

(12) 
(10) Patent No.: US 6,320,459 B2
(45) Date of Patent: Nov. 20, 2001

(54) NOTCH FILTER IMPLEMENTED USING ANALOG SAMPLING

(76) Inventor: Rob McCullough, 172 Hamilton Ct., Los Altos, CA (US) 94022

(*) Notice: Subject to any disclaimer, the term of this patent is extended or adjusted under 35 U.S.C. 154(b) by 0 days.

(21) Appl. No.: 09/739,729

(22) Filed: Dec. 18, 2000

Related U.S. Application Data

(60) Continuation-in-part of application No. 09/487,463, filed on Jan. 19, 2000, now Pat. No. 6,166,567, which is a division of application No. 08/976,825, filed on Nov. 24, 1997, now Pat. No. 6,072,360.

(51) Int. Cl.[7] ............................................. H04B 1/10
(52) U.S. Cl. ................................. 327/558; 327/556
(58) Field of Search ................................ 327/551, 552, 327/553, 554, 555, 556, 557, 558, 559, 91, 94, 337; 330/9, 294, 306, 303

(56) References Cited

U.S. PATENT DOCUMENTS

| | | | |
|---|---|---|---|
| 4,496,859 | * | 1/1985 | Crooks ................................. 327/556 |
| 4,939,473 | * | 7/1990 | Eno ...................................... 327/556 |
| 6,072,360 | * | 6/2000 | McCullock .......................... 327/558 |
| 6,166,567 | * | 12/2000 | McCullock ............................ 327/91 |
| 6,194,959 | * | 2/2001 | Kamoshida et al. ................. 327/552 |

\* cited by examiner

*Primary Examiner*—Timothy P. Callahan
*Assistant Examiner*—Linh Nguyen
(74) *Attorney, Agent, or Firm*—Douglas L. Weller

(57) ABSTRACT

A filter system includes a low pass filter, a first summer circuit, a second low pass filter and a second summer circuit. The first low pass filter includes an input, an output, a storage means, a switching means and a control means. An input signal is placed on the input. An output signal is generated on the output. The storage means provides storage of a signal sample over time. The switching means, when closed, electrically couples the input to the first end of the storage means. The switching means, when open electrically isolates the input from the first end of the storage means. The control means controls the switching means. The control means generates a switching control signal. The switching control signal has a sampling frequency. A maximum cutoff frequency of the low pass filter is dependent on a value of a capacitance provided by the storage means, the sampling frequency, and a pulse width of the switching control signal. The first summer circuit subtracts the output signal from the input signal to produce a high pass output signal. The second low pass filter receives the high pass output signal and produces a bandpass filtered output. The second summer circuit subtracts the bandpass filtered output from the input signal to produce a notch filtered output.

10 Claims, 33 Drawing Sheets

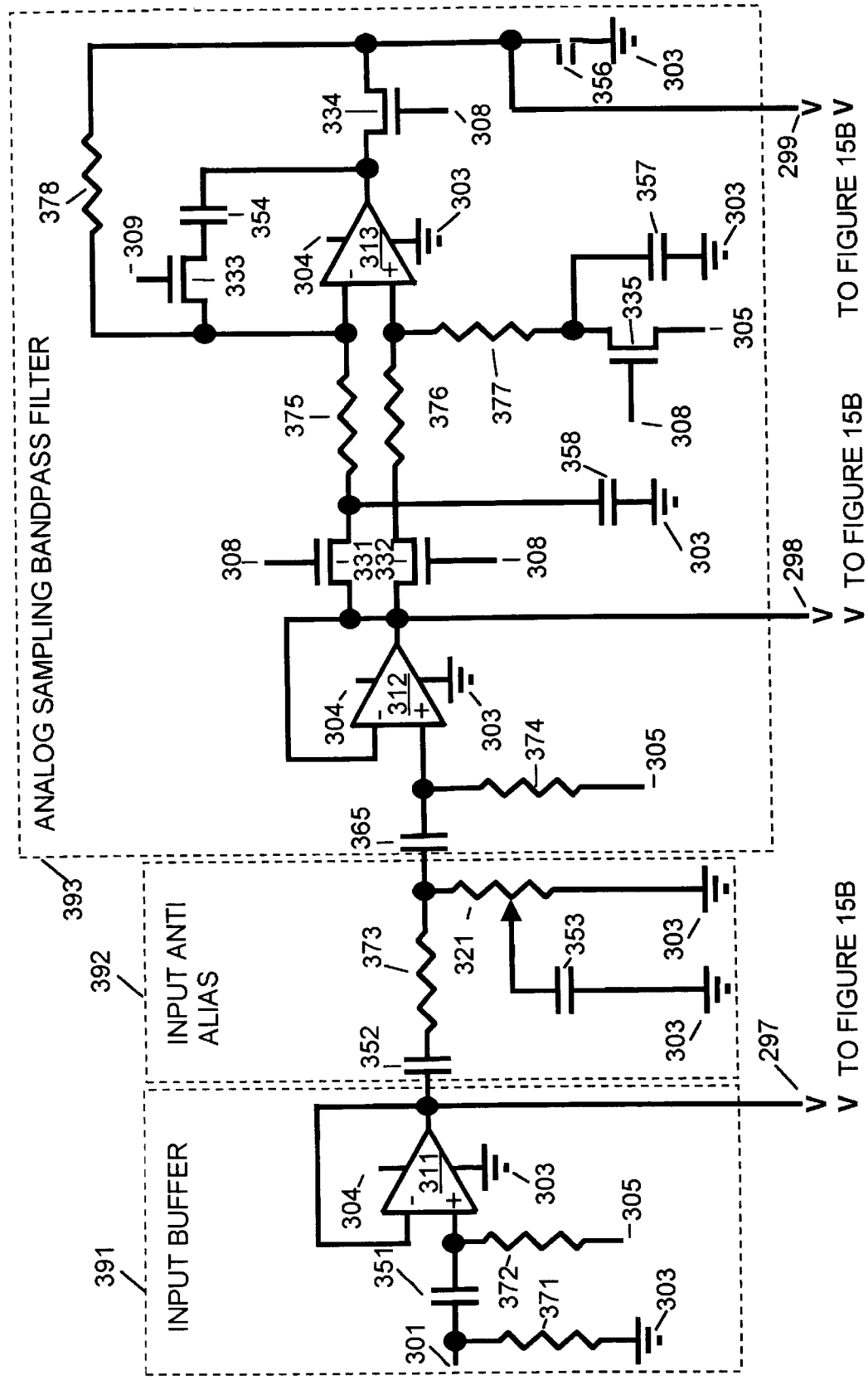

NOTCH FILTER IMPLEMENTED USING ANALOG SAMPLING

CROSS REFERENCE TO RELATED APPLICATION

This application is a continuation-in-part of application Ser. No. 09/487,463, filed Jan. 19, 2000, U.S. Pat. No. 6,166,567, which is a division of application Ser. No. 08/976,825, filed Nov. 24, 1997, U.S. Pat. No. 6,072,360.

BACKGROUND

The present invention concerns design of filters for electrical circuits and pertains particularly to a notch filter implemented using analog sampling.

A filter rejects some frequencies within a signal and allows other frequencies to be transmitted. In a low-pass filter the frequencies that are transmitted extend from zero to some maximum frequency. In a high-pass filter the frequencies that are transmitted are greater than some minimum frequency. In a band-pass filter, the frequencies that are transmitted are between a minimum frequency and a maximum frequency. In a notch filter, a very narrow range of frequencies is removed from the signal.

There are many ways to construct filters. Generally, when designing filters it is desirable to very particularly pass only desired frequencies while as completely as possible rejecting other frequencies. Generally, filters that are very effective at passing desired frequencies and rejecting other frequencies are difficult to design and expensive to build. The present invention sets out filters that are elegant in design, inexpensive to build and extremely effective.

SUMMARY OF THE INVENTION

In accordance with the preferred embodiment of the present invention, a filter system is presented. The filter system includes a low pass filter. The first low pass filter includes an input, an output, a storage means, a switching means and a control means. An input signal is placed on the input. An output signal is generated on the output. The storage means provides storage of a signal sample over time. The switching means, when closed, electrically couples the input to the first end of the storage means. The switching means, when open electrically isolates the input from the first end of the storage means. The control means controls the switching means. The control means generates a switching control signal. The switching control signal has a sampling frequency. A maximum cutoff frequency of the low pass filter is dependent on a value of a capacitance provided by the storage means and a pulse width of the switching control signal.

The filter system also includes a first summer circuit, a second low pass filter and a second summer circuit. The first summer circuit subtracts the output signal from the input signal to produce a high pass output signal. The second low pass filter receives the high pass output signal and produces a bandpass filtered output. The second summer circuit subtracts the bandpass filtered output from the input signal to produce a notch filtered output.

For example, the first summer circuit is implemented using a differential amplifier. The second summer circuit also can be implemented using a differential amplifier.

The output varies based on the pulse width of the switching control signal. For example, the control means varies the pulse width of the switching control signal to change the maximum cut off frequency of the low pass filter. In a preferred embodiment of the present invention, the control means allows the pulse width of the switching control signal to be reduced so that the maximum cut off frequency of the low pass filter is less than the sampling frequency divided by two. Alternatively, or in addition, the control means allows the pulse width of the switching control signal to be set at a value that allows for a cutoff frequency of the low pass filter to be equal to the sampling frequency divided by two. Alternatively, or in addition, the control means also allows the pulse width of the switching control signal to be set at a value that allows for a cutoff frequency of the low pass filter to be greater than the sampling frequency divided by two. Alternatively, or in addition, the control means allows the pulse width of the switching control signal to be set at a value that allows for signal spikes at harmonics of the sampling frequency to be included in a pass band of the low pass filter.

The present invention provides for a cost effective way to design a notch filter with a center frequency that is determined by the sample frequency (Fsample) and the sample pulse width (Fsample width). The bandwidth is determined by the sample pulse width (Fsample width) and is inversely proportional to the sample pulse width. A notch bandwidth equal to 1 Hz is possible at almost any center frequency from DC to Fsample/2. At any notched frequency, with the bandwidth equal to 1 Hz, the output wave form of the notch filter will be a square wave. By adjusting the sample width of Fsample, from a minimum to a maximum of ¼ the period of Fsample as the frequency of Fsample is adjusted from a maximum to a minimum of two times the frequency of the input signal, the notch bandwidth of the filter approaches 1 Hz, and the peak output amplitude at resonance can be made equal to the peak input amplitude of that sampled signal. Hence, the filter has a gain of "1". In notch filter designs, where a low pass analog sampling filter network is used in a negative feedback loop for improved filter performance, adjustment of Fsample width, from a minimum to a maximum of ¼ the period of Fsample as the frequency of Fsample is adjusted from a maximum to a minimum of two times the frequency of the input signal, will cause a gain of greater than 1. If the filter, through adjustment of Fsample and Fsample width, attempts to resolve a notch bandwidth less than 1 Hz at any center frequency, the filter will oscillate and lock on that frequency. These simple relationships allow extremely fine adjustment and selection of any desired notch frequency and bandwidth (hence filter quality "Q") performance. The simplicity and versatility of design using analog sampling technology as set forth, are significant improvements over prior art notch filters.

BRIEF DESCRIPTION OF THE DRAWINGS

FIGS. 15A, 15B and 15C show an analog sampling processor with a passive anti-alias filter, an analog sampling bandpass filter with active integration, sample magnitude comparison and sample signal control gating in accordance with a preferred embodiment of the present invention.

DESCRIPTION OF THE PREFERRED EMBODIMENTS

Figure 1:
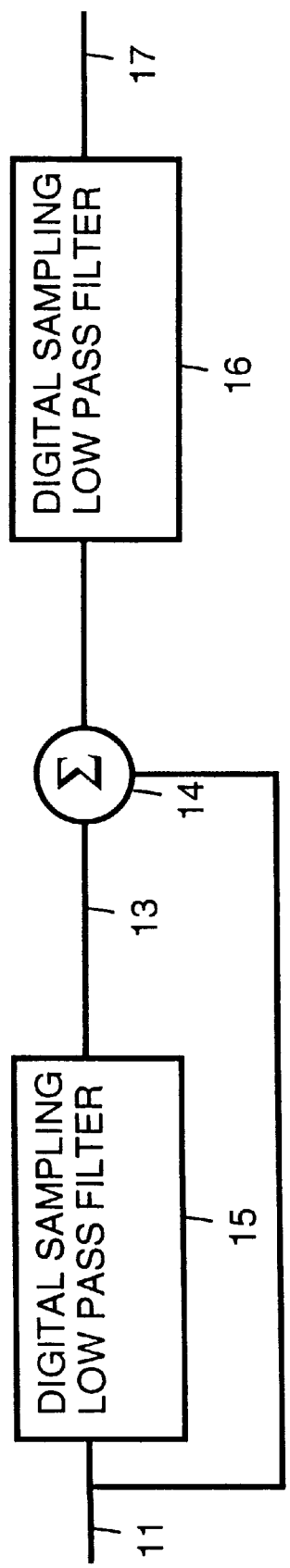
FIG. 1 is a block diagram of an implementation of a bandpass filter, in accordance with a preferred embodiment of the present invention.

FIG. 1 shows a simplified block diagram of a bandpass filter. An input signal is received on an input 11. An analog sampling low pass filter 15 and a summer 14 implement a high pass filter. Analog sampling low pass filter 15 filters the input signal to produce a filtered signal on an output 13. Summer 14 subtracts the filtered signal on output 13 from input 11 to implement the high pass filter. An analog sampling low pass filter 16 filters the signal output of summer 14 to produce an output 17 and complete the bandpass filtering of the input signal.

Figure 2:
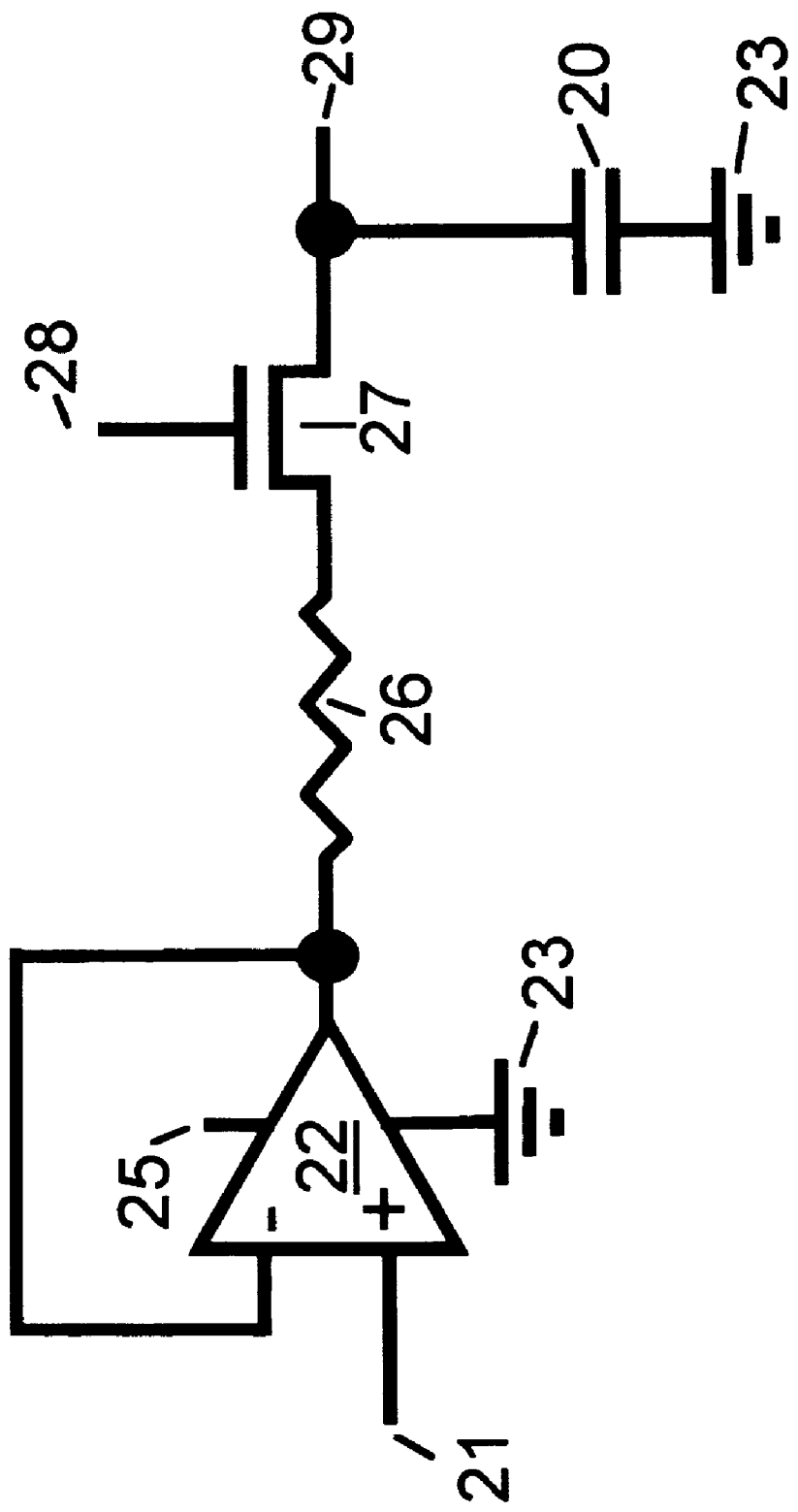
FIG. 2 shows an analog sampling low-pass filter used in the bandpass filter of FIG. 1, in accordance with a preferred embodiment of the present invention.
Figure 16:
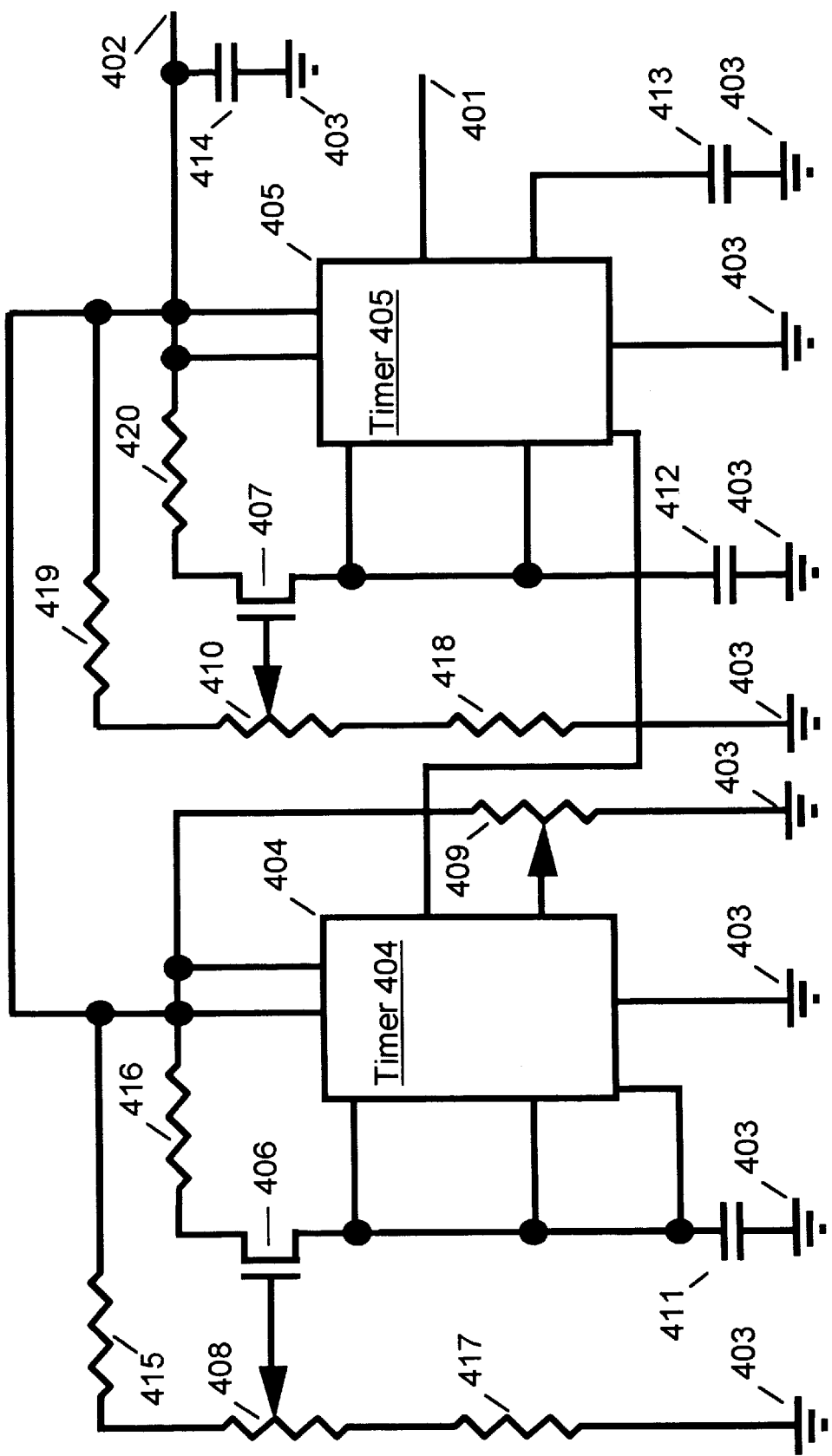
FIG. 16 is a sample signal generator circuit used to generate a sample signal and control its signal frequency and pulse width in accordance with a preferred embodiment of the present invention.

FIG. 2 shows a simplified design of an analog sampling low pass filter that may be used to implement analog sampling low pass filter 15 and analog sampling low pass filter 16 shown in FIG. 1. A gate (switch) 27 is controlled by a sampling control signal (Fsample) generated by a sample signal generator circuit and applied to control input 28 of gate 27. Gate 27 is, for example, a MOSFET, a JFET, or some other type of transistor. An example of a sample signal generator circuit is shown in FIG. 16. A capacitor 20 stores a voltage sample on output 29 of the signal voltage that propagates through gate 27. A resistor 26 represents resistance through gate 27. An operational amplifier 22 acts as a buffer to receive an input signal on an input 21 and forwards the input signal to gate 27. Operational amplifier 22 is also connected to, for example, a VCC voltage 25 of five volts and a ground 23.

In order to understand the operation of the analog sampling low pass filter shown in FIG. 2, it is helpful to understand Nyquist's sampling theorem and how it applies to the circuit. Since amplifier 22 is a unity gain buffer, any voltage at input 21 can be sampled and held by opening and then closing gate 27 and thereby applying voltage across capacitor 20.

Presuming ideal conditions, capacitor 20 can only charge as high as the level of the input voltage on input 21 and will hold the voltage indefinitely when gate 27 is opened. Ideal conditions assumes the output impedance of amplifier 22 is zero ohms, capacitor 20 is a perfect non-leaky capacitor and gate 27 is a perfect switch with 0 ohms impedance (i.e., resistor 26 is 0 ohms) and no inductive or capacitive noise voltage is generated when gate 27 opens and closes.

Nyquist's sampling theorem says that any periodic input signal occurring at some frequency (InFreq) must be sampled, at a frequency (Fsample), at least two times faster than that frequency (i.e., Fsample=2×InFreq) in order for that input signal to be observed at the output.

Figure 3:
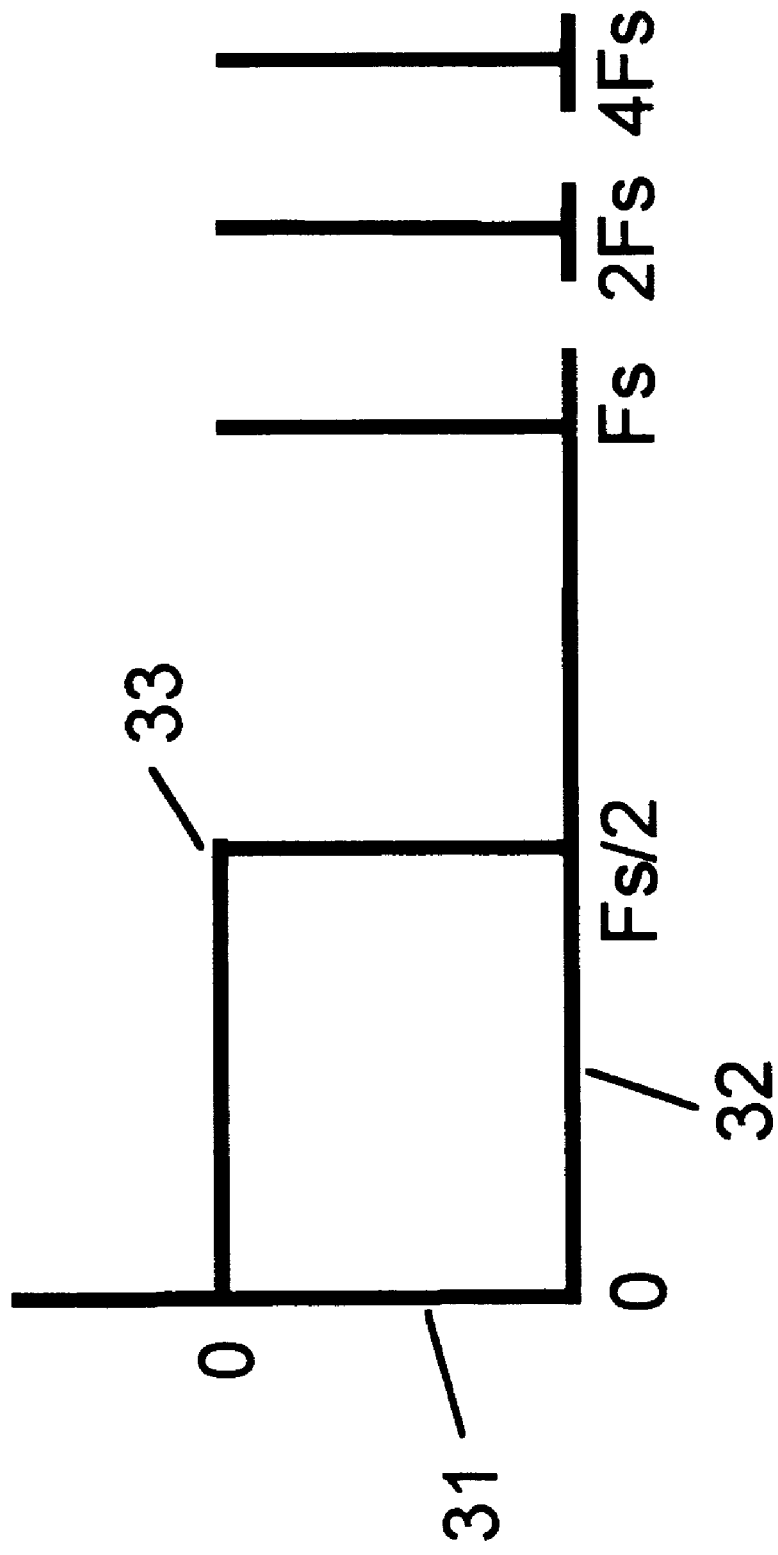
FIG. 3, FIG. 4, FIG. 5 and FIG. 6 are frequency response graphs used to explain the operation of the low-pass filter shown in FIG. 2.

Based on Nyquist's sampling theorem, the frequency response of the circuit of FIG. 2, under the above-described ideal conditions, is flat from DC to Fsample divided by two. In other words, there is no change in output voltage amplitude from zero hertz to Fsample divided by two. This is illustrated by the frequency response graph in FIG. 3. In FIG. 3, an axis 31 indicates output voltage (in decibels), and an axis 32 indicates output frequency (in hertz). As shown by FIG. 3, an output signal 33 drops off rapidly at an output frequency of one half the sampling frequency (Fs/2) and from there on consists of spikes at harmonics of the sampling frequency (Fs, 2Fs, 4Fs, etc.). In addition, according to Nyquist's sampling theorem, the shape of output signal 33 will become square as the frequency of the input signal approaches the sample frequency (Fsample) divided by 2. A square wave occurs at this point since there are only two samples to capture one complete cycle.

However, we do not live in an ideal physical world. For example, gate 27 is a CMOS bilateral analog switch with a very large off-resistance (greater than 10 megohms) and an on-resistance (i.e., resistor 26) equal to approximately one to two kilohms. While the off-resistance is near ideal, the on-resistance is nowhere near the ideal of zero ohms of resistance. This on-resistance is due to MOSFET channel resistance.

When taking into account the non-ideal characteristics of CMOS switches, op-amps and capacitors, combined with Nyquist's sampling theorem, various effects can be observed about the operation of the filter of FIG. 2.

First, if the sample width of frequency sampling control signal (Fsample) generated by a frequency sampling control signal generator 28 is made small enough with respect to the period of Fsample and capacitor 20 is made large enough, then it is possible to integrate away or roll off the harmonics of the output signal on output 29. This is illustrated by FIG. 4.

Figure 4:
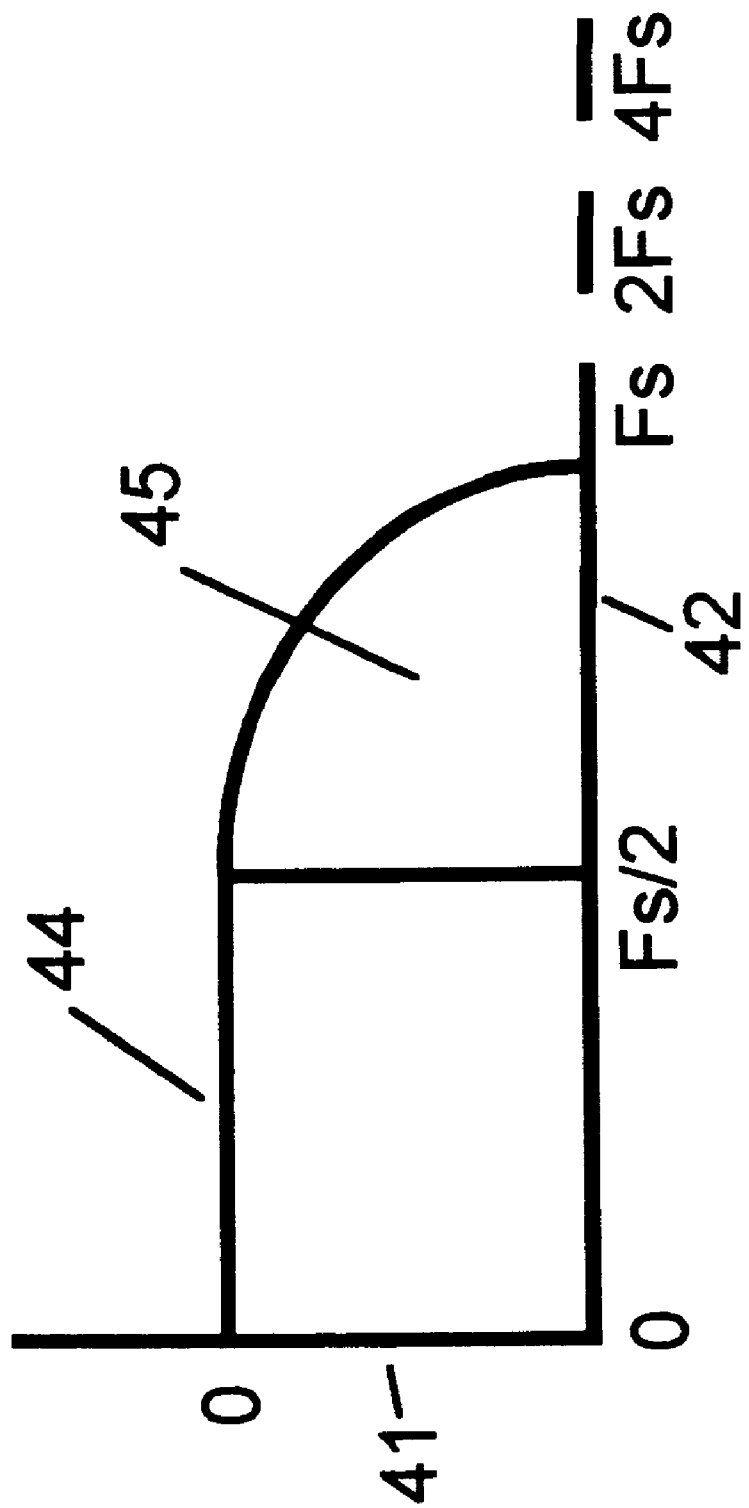

In FIG. 4, an axis 41 indicates output voltage (in decibels), and an axis 42 indicates output frequency (in hertz). As shown by FIG. 4, an output signal 44 drops off rapidly at an output frequency of one half the sampling frequency (Fs/2). The signal spikes at harmonics of the sampling frequency (Fs, 2Fs, 4Fs, etc.) have been removed by the integration resulting from correct selection of the sampling frequency of the frequency sampling control signal (Fsample) generated by a frequency sampling control signal generator 28 and the size of capacitor 20. An area 45 from Fs/2 to Fs represents a virtual roll off caused by the integration.

Figure 5:
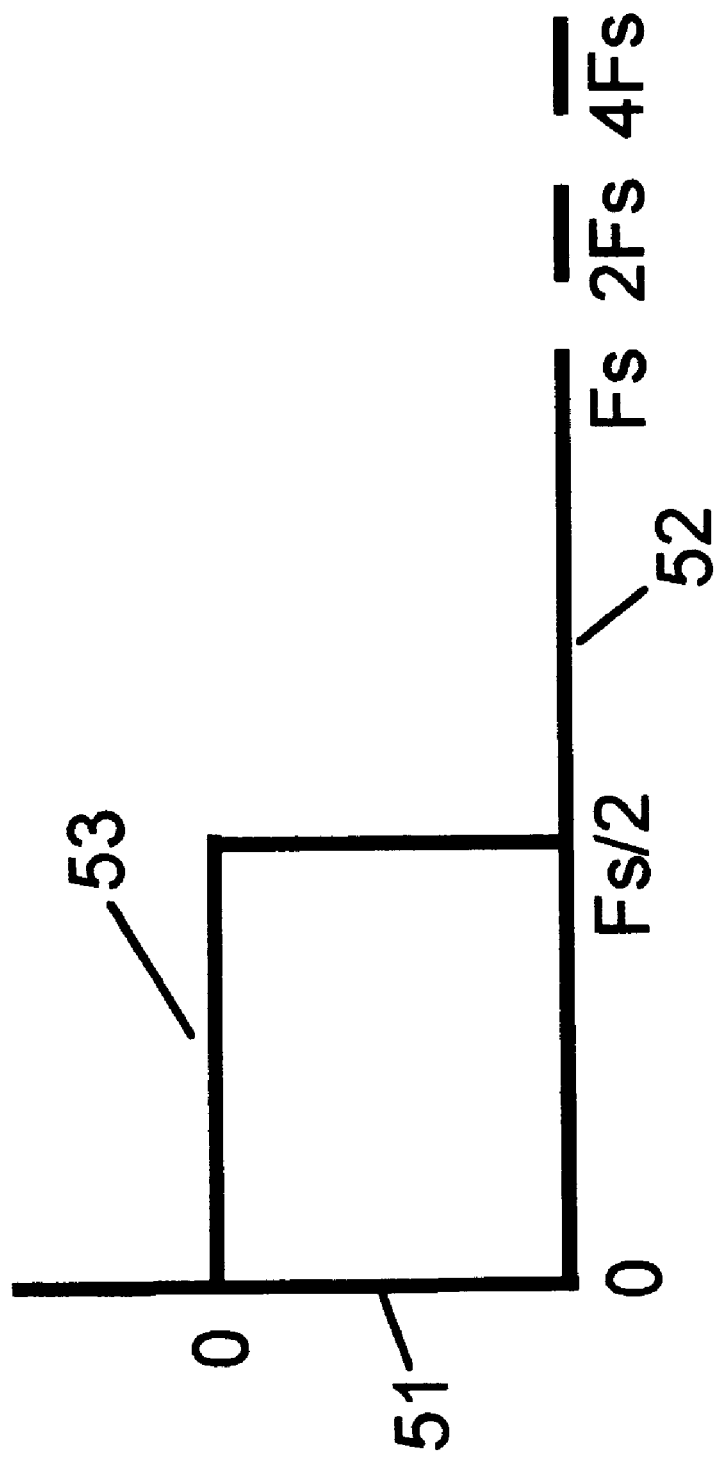

The roll off shown in FIG. 4 allows for resolution of an ideal pass band. This is illustrated in FIG. 5. In FIG. 5, an axis 51 indicates output voltage (in decibels), and an axis 52 indicates output frequency (in hertz). As shown by FIG. 5, the actual resulting pass band for output signal 53 becomes square as the frequency of the input signal approaches one half the sampling frequency (Fs/2). A square wave occurs at this point, according to Nyquist's sampling theorem, since there are only 2 samples to capture one complete cycle.

As the pulse width of the control signal (Fsample) generated by a frequency sampling control signal generator 28 is decreased, this causes the filter of FIG. 2 to behave like a variable pole filter. The reduced time for capacitor 20 to charge also reduces sample amplitudes at frequencies smaller than Fs/2.

Figure 6:
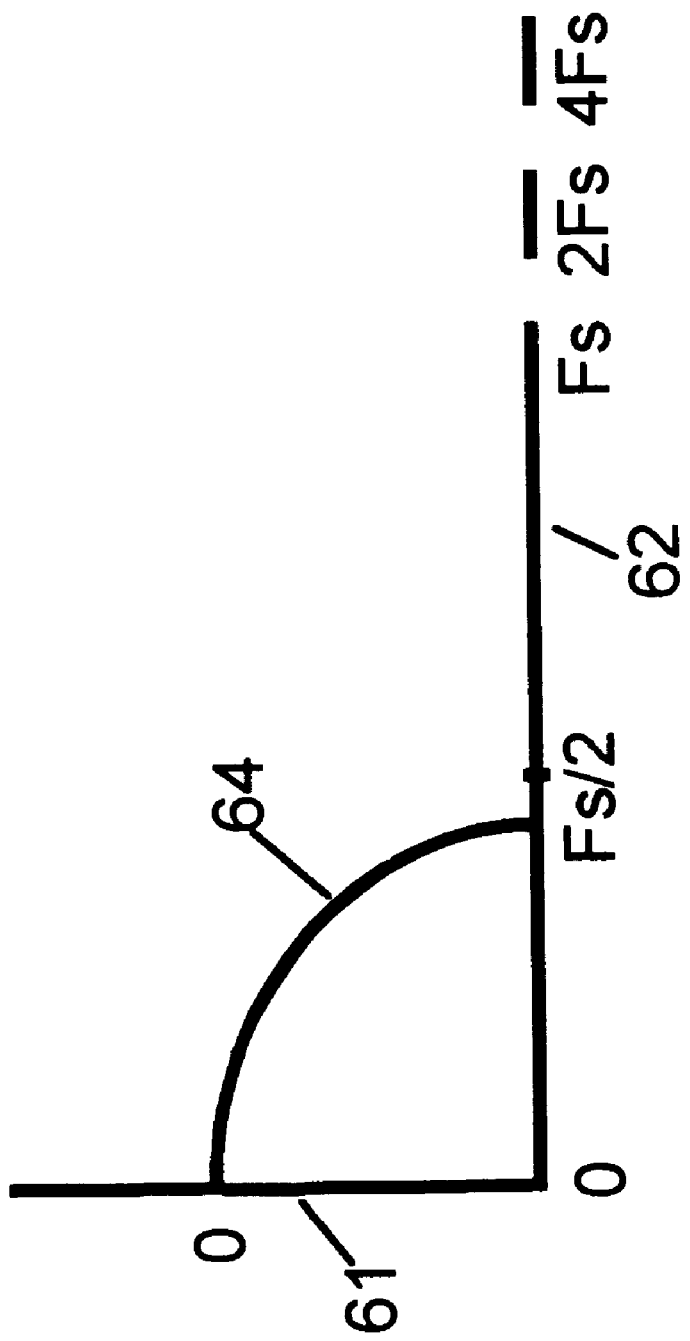

This is illustrated in FIG. 6. In FIG. 6, an axis 61 indicates output voltage (in decibels), and an axis 62 indicates output frequency (in hertz). As shown by FIG. 6, reduction in the width of the pulse of the control signal (Fsample) generated by a frequency sampling control signal generator 28, results in the pass band for output signal 64 having a maximum cutoff frequency within Fs/2. Continuing to reduce the pulse width of Fsample, can be used to control and establish that the maximum cutoff frequency occurs within Fs/2. The major benefit of this is a significant over sampling of much of the bandwidth and the recovery of sinusoid fundamental wave forms.

Using these principles, other analog sampling filters, similar to that shown in FIG. 2, can be constructed that are also in accordance with the present invention.

Figure 7:
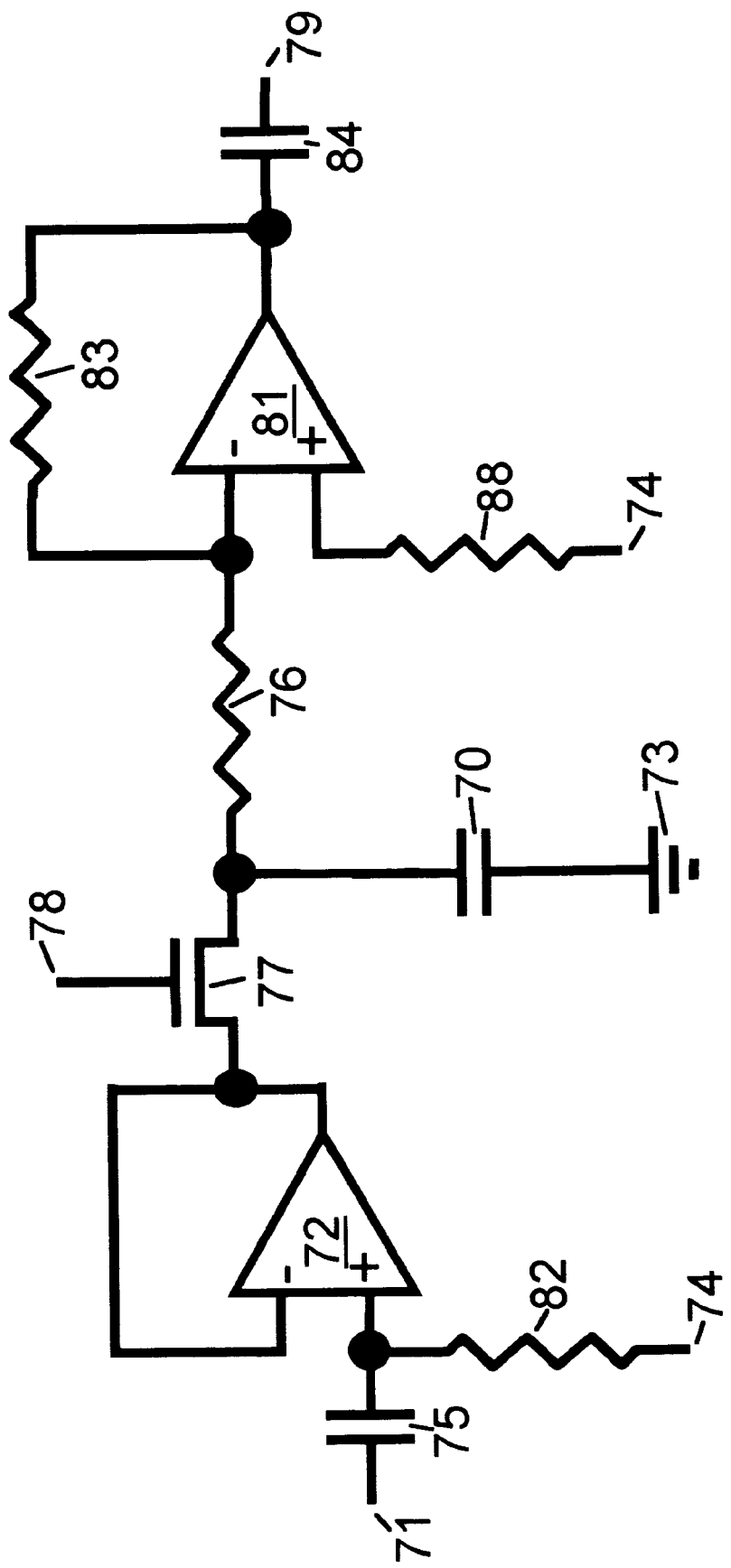
FIG. 7 is an analog sampling inverting low-pass filter in accordance with a preferred embodiment of the present invention.

For example, FIG. 7 shows an implementation of an analog sampling inverting low pass filter. A gate 77 is controlled by a frequency sampling control signal generated by a frequency sampling control signal generator 78. A capacitor 70, connected to a ground 73, is used to hold on an output signal from gate 77. An operational amplifier 72, with bias resistor 82, acts as a buffer to receive an input signal on an input 71 and forwards the input signal to gate 77. An input capacitor 75 serves to couple signals to operational amplifier 72. An operational amplifier 81 and three bias resistors 76, 83 and 88 buffer and invert the signal received from gate 77. An output capacitor 84 serves to couple signals from operational amplifier 81 to an output 79. Operational amplifiers 72 and 81 also have a supply voltage of VCC. A bias voltage of VCC/2 is placed on node 74.

In FIG. 7, circuitry composed of capacitor 75, amplifier 72, a resistor 82, gate 77 and capacitor 70 create a low pass analog sampling filter. The output of the low pass analog sampling filter is then buffered and inverted by the unity gain amplifier created by operational amplifier 81 and three bias resistors 76, 83 and 88. As discussed above, the low pass analog sampling filter can resolve an ideal pass band from DC to Fs/2, as was illustrated by FIG. 5. In addition, careful control of the width of the frequency sampling control signal generated by a frequency sampling control signal generator 78 permits over sampling of the pass band and recovery of sinusoid fundamental wave forms as was illustrated by FIG. 6.

Figure 8:
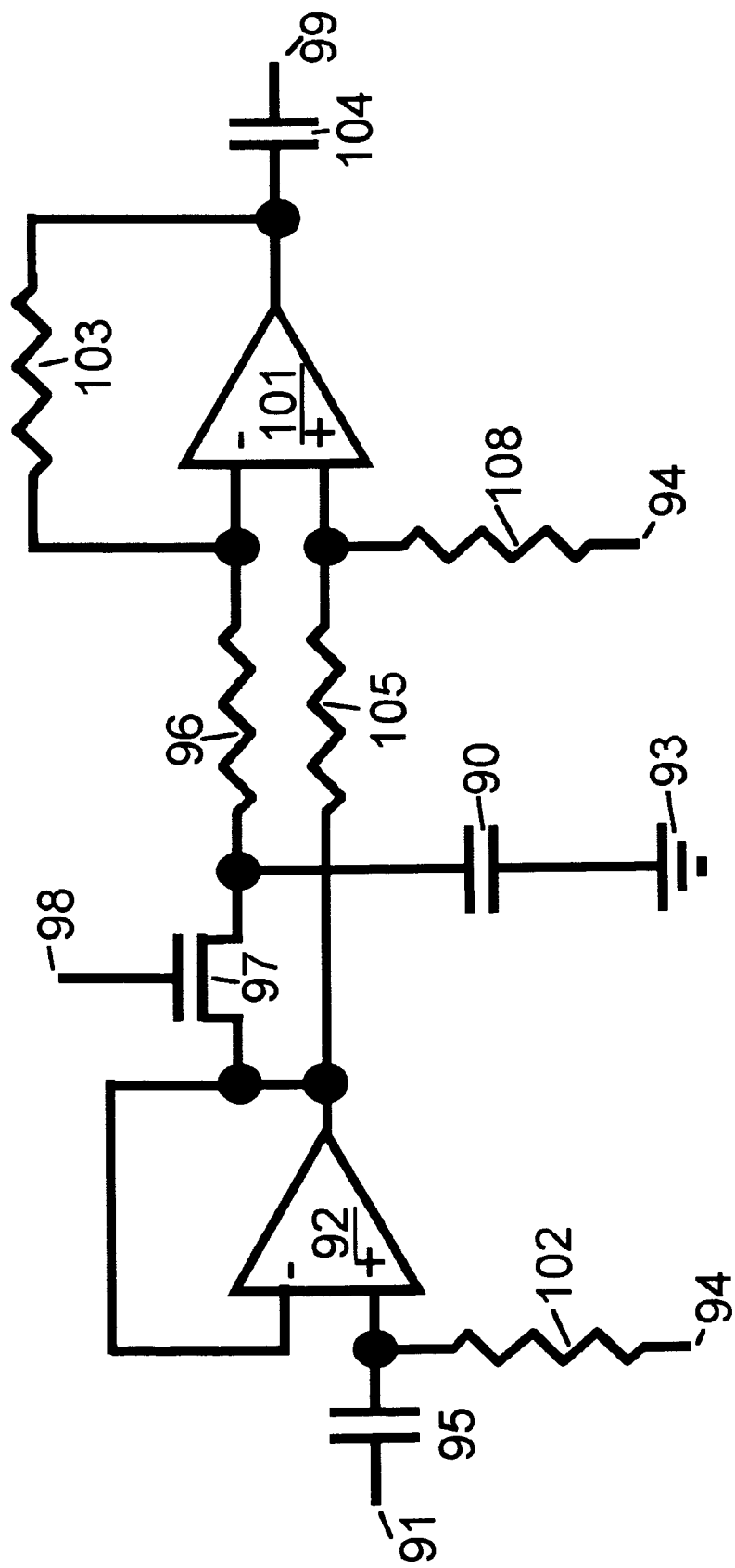
FIG. 8 is an analog sampling non-inverting high-pass filter in accordance with a preferred embodiment of the present invention.

FIG. 8 shows an implementation of an analog sampling non-inverting high pass filter. A gate 97 is controlled by a frequency sampling control signal generated by a frequency sampling control signal generator 98. A capacitor 90, connected to a ground 93, is used to hold on an output signal from gate 97. An operational amplifier 92, with bias resistor 102, acts as a buffer to receive an input signal on an input 91 and forwards the input signal to gate 97. An input capacitor 95 serves to couple input 91 to operational amplifier 92. The output signal from gate 97 is a low pass band of the input signal to gate 97. An operational amplifier 101 and four bias resistors 96, 103, 105 and 108 act as a unity gain differential amplifier that subtracts the (low pass band) at the output of gate 97 from the signal at the input to gate 97 to produce a high pass filter. An output capacitor 104 serves to couple signals from operational amplifier 101 to an output 99. Operational amplifiers 92 and 101 have a supply voltage of VCC. A bias voltage of VCC/2 is placed on node 94.

Figure 9:
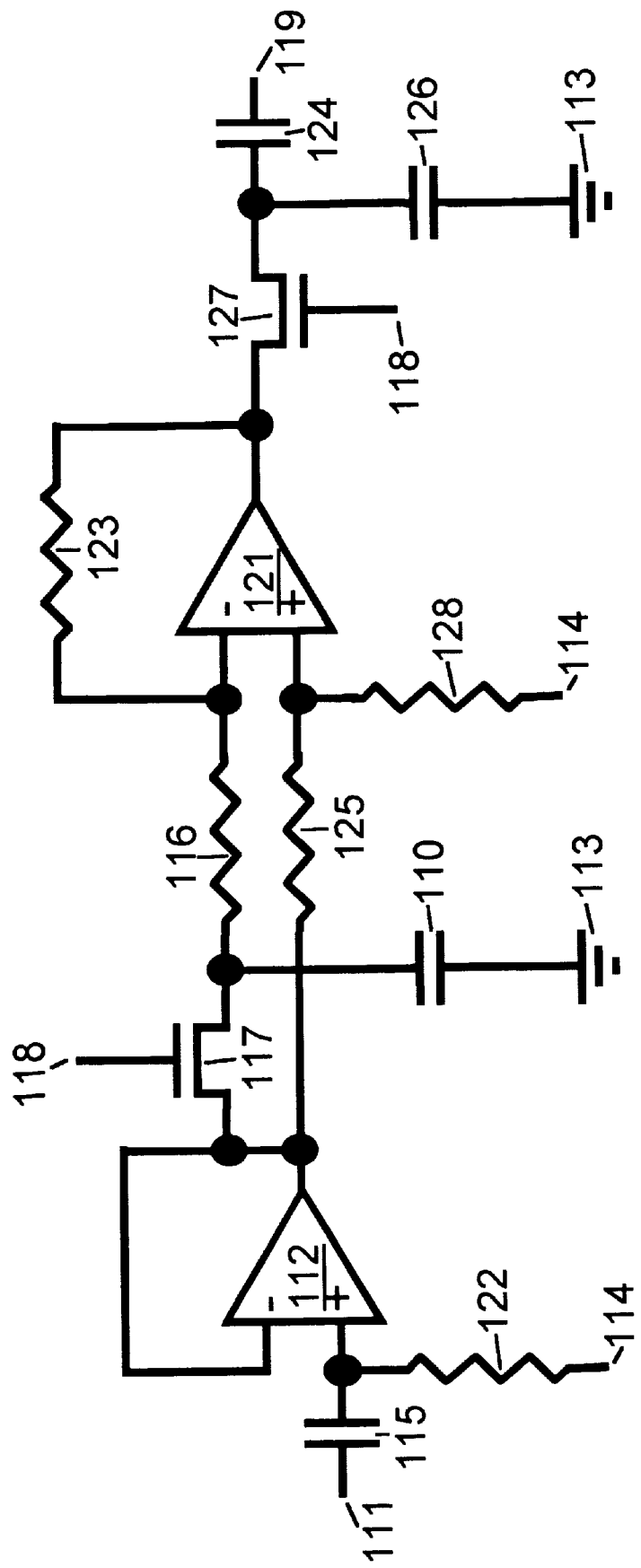
FIG. 9 is an analog sampling non-inverting bandpass filter with gain less than or equal to one in accordance with a preferred embodiment of the present invention.

Note that with the addition of only a single resistor (resistor 105), inverting low pass filter of FIG. 7 can be transformed to the non-inverting high pass filter shown in FIG. 9.

FIG. 9 shows an implementation of an analog sampling bandpass filter with a gain at resonance of less than or equal to one. A gate 117 is controlled by a sampling signal generated by a sample signal generator circuit and applied to control input 118 of gate 117. An example of a sample signal generator circuit is shown in FIG. 16. A capacitor 110, connected to a ground 113, is used to hold a sample of an output signal from gate 117. An operational amplifier 112, with a resistor 122, acts as a buffer to receive an input signal on an input 111 and forwards the input signal to gate 117. An input capacitor 115 serves to couple input 111 to operational amplifier 112. An operational amplifier 121 and four bias resistors 116, 123 125, and 128 buffer and invert the signal received from gate 117. An output capacitor 124 serves to couple signals from operational amplifier 121 to an output 119.

A capacitor 126 is connected between gate 127 and ground 113. Gate 127 is also connected as shown to the output of amplifier 121. Gate 127 is controlled by the sampling control signal generated by sample signal generator circuit (for example, as shown in FIG. 16) and applied to gate control input 118. The output frequency bandwidth at output 119 is a low pass sampled response from the output of amplifier 121 of the output frequency response of amplifier 112 minus a low passed sampled response of the output of amplifier 112. Operational amplifiers 112 and 121 have a supply voltage of VCC. A bias voltage of VCC/2 is placed on node 114.

Figure 10:
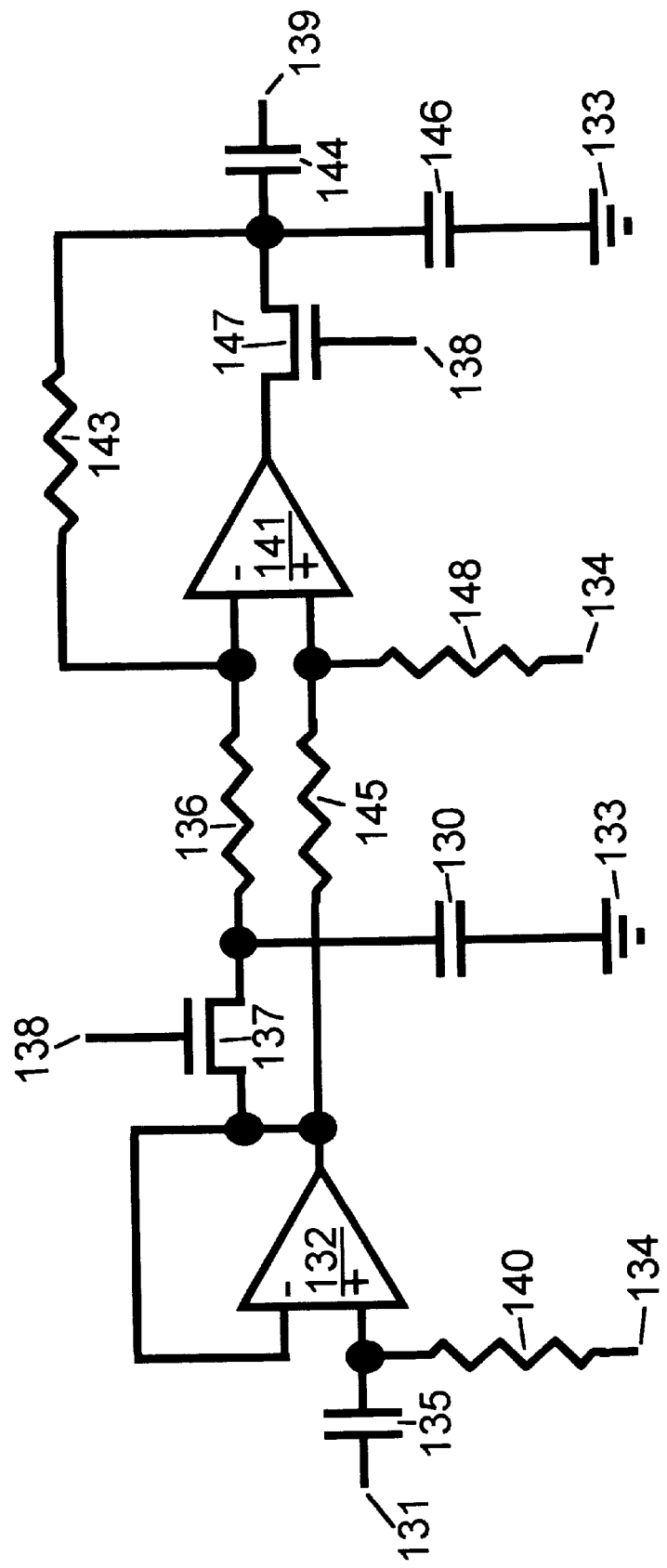
FIG. 10 is an analog sampling non-inverting bandpass filter with gain greater than one possible in accordance with a preferred embodiment of the present invention.

FIG. 10 shows an implementation of an analog sampling non-inverting bandpass filter with a gain at resonance of greater than one possible. A gate 137 is controlled by the sampling control signal generated by sample signal generator circuit (for example, as shown in FIG. 16) and applied to a gate control input 138. A capacitor 130, connected to a ground 133, is used to hold a sample of the output signal from gate 137. An operational amplifier 132, with a bias resistor 140, acts as a buffer to receive an input signal on an input 131 and forwards the input signal to gate 137. An input capacitor 135 serves as a coupling capacitor from input 131 to operational amplifier 132. The output signal from gate 137 is a low pass band of the input signal to gate 137. An operational amplifier 141 and four bias resistors 136, 143, 145 and 148 acts as a unity gain differential amplifier that subtracts the (low pass band) at the output of gate 137 from the signal at the input signal to gate 137 to produce a high pass filter. An output capacitor 144 serves as a coupling capacitor for signals from the output of a gate 147 to an output 139. Operational amplifiers 132 and 141 have a supply voltage of VCC. A bias voltage of VCC/2 is placed on node 134.

Gate 147 and a capacitor 146, connected to a ground 133, are added to the feedback loop of amplifier 141. Gate 147 is controlled by the sampling control signal generated by the sample signal generator circuit (for example, as shown in FIG. 16) and applied to the gate control input at gate control input 138. Gate 147 serves to peak the output signal of output 139 at resonance as well as cut the frequencies beyond resonance. Thus the circuit of FIG. 10 functions as a bandpass filter with gain greater than one possible.

Figure 11:
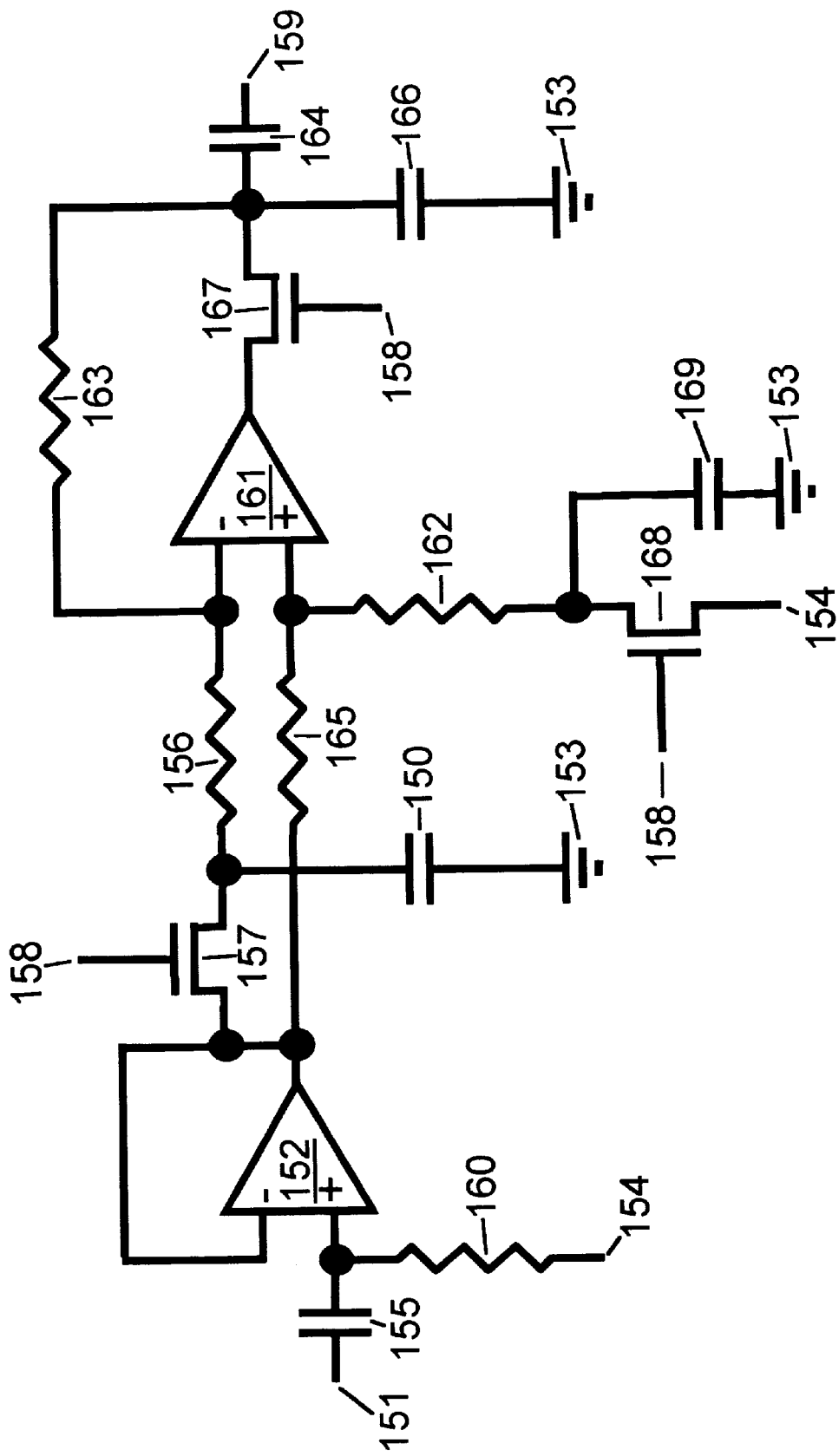
FIG. 11 is a balanced analog sampling non-inverting bandpass filter in accordance with a preferred embodiment of the present invention.

FIG. 11 shows an implementation of a balanced, or frequency compensated, analog sampling non-inverting bandpass filter with gain greater than one possible at resonance. A gate 157 is controlled by the sampling control signal generated by the sample signal generator circuit (for example, as shown in FIG. 16) and applied to the gate control input at node 158. A capacitor 150, connected to a ground 153, is used to hold an output signal sample from gate 157. An operational amplifier 152 acts as a buffer to receive an input signal on an input 151 and forwards the input signal to gate 157. An input capacitor 155 serves to couple the input to operational amplifier 152. The output signal from gate 157 is a low pass band of the input signal to gate 157. An operational amplifier 161 and four bias resistors 156, 162, 163 and 165 acts as a unity gain differential amplifier that subtracts the (low pass band) at the output of gate 157 from the signal at the input to gate 157 to produce a high pass filter. An output capacitor 164 serves to couple signals from a gate 167 to an output 159. A gate 168 and a capacitor 169, connected to a ground 153, function as reconfigurable impedance connected to an input of operational amplifier 161. Gate 168 is controlled by the frequency sampling signal generated by the sample signal generator circuit (for example, as shown in FIG. 16) and applied to the gate control input at node 158. The impedance across gate 168 is varied by varying the sampling frequency and pulse width of the control signal generated by the sample signal generator circuit (for example, as shown in FIG. 16) and placed on node 158. A node 154 is set at VCC/2 with a resistor 160 connected between node 154 and the non-inverting input of operational amplifier 152. Operational amplifiers 152 and 161 have a supply voltage of VCC. A bias voltage of VCC/2 is placed on node 154.

Gate 167 and a capacitor 166, connected to ground 153, are added to the feedback loop of amplifier 161. Gate 167 is controlled by the frequency sampling control signal generated by a sample signal generator circuit (for example, as shown in FIG. 16) and applied to the gate control input at node 158. Gate 167 serves to peak the output signal of output 159 at resonance as well as cut the frequencies beyond resonance. Thus the circuit of FIG. 11 functions as a bandpass filter.

The circuit of FIG. 11, like the circuit of FIG. 10, is primarily a standard differential amplifier configuration. However, unlike most conventional bandpass designs that use passive RC networks for bias and feedback, the circuit of FIG. 11 uses active analog sampling impedance networks. Gate 157 and capacitor 150 can be thought of as forming an active impedance network to cut frequencies from Fsample through DC. The output of amplifier 161 is initially differentiated. Gate 167 and capacitor 166 form an active impedance network to integrate the output of amplifier 161. Gate 169 and capacitor 168 form an active impedance network to balance, or frequency compensate, amplifier 161. These active networks form a filter that can differentiate (high pass) the signal then integrate the signal (low pass) as a function of sample frequency and pulse width.

Figure 12:
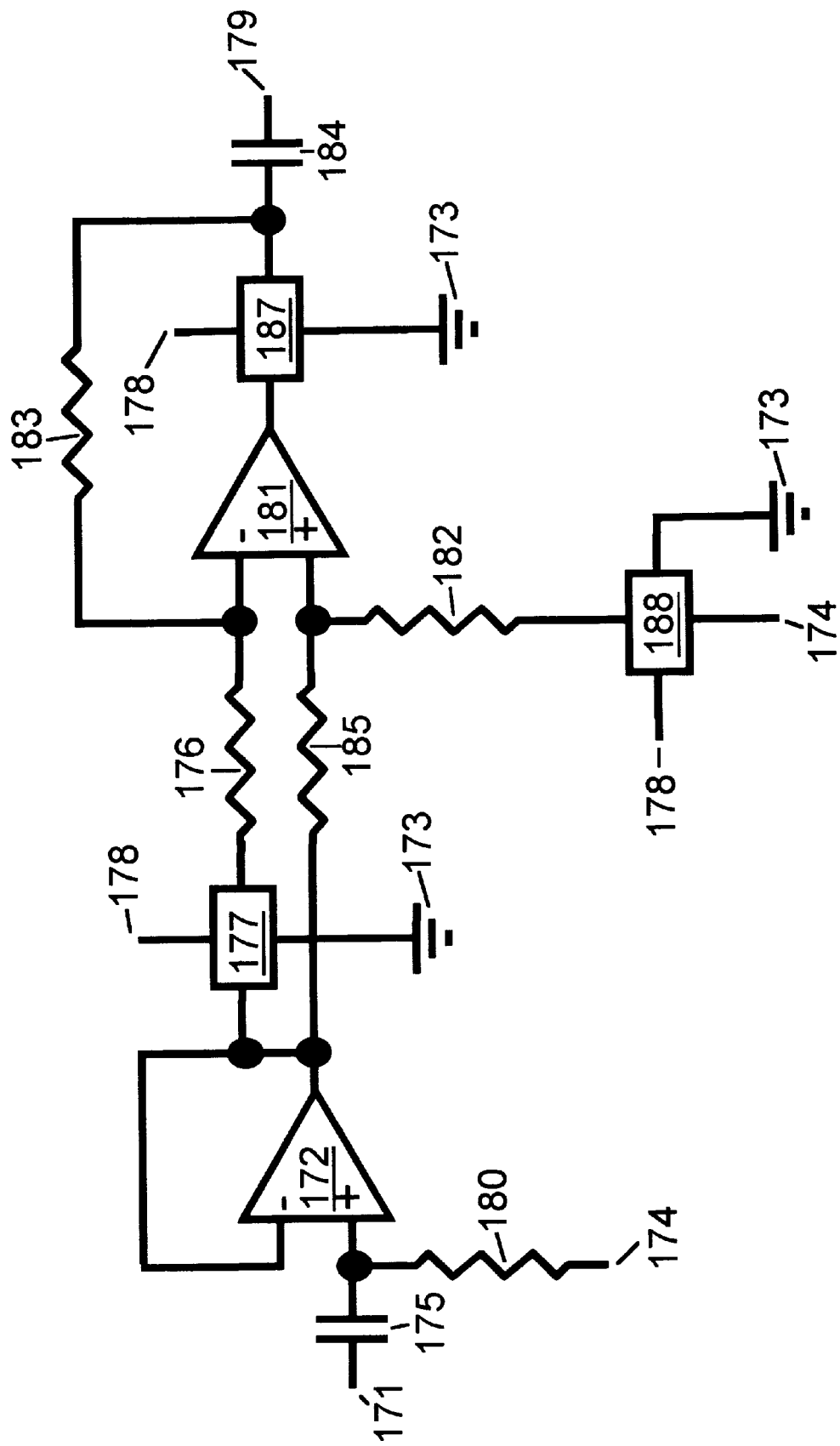
FIG. 12 is an active impedance model of the balanced analog sampling non-inverting bandpass filter shown in FIG. 11 in accordance with a preferred embodiment of the present invention.

FIG. 12 shows an active impedance model of the compensated analog sampling non-inverting bandpass filter shown in FIG. 11. In FIG. 12, an active impedance 177, connected to a ground 173, is controlled by a frequency sampling control signal, generated by a sample signal generator circuit such as that shown in FIG. 16, and applied to control signal input 178. An operational amplifier 172 acts as a buffer to receive an input signal on an input 171 and forwards the input signal to active impedance 177. An input capacitor 175 serves to couple operational amplifier 172 to input 171. The output signal from active impedance 177 is a low pass band of the input signal to active impedance 177. An operational amplifier 181 and four bias resistors 176, 182, 183 and 185 acts as a unity gain differential amplifier that subtracts the (low pass band) at the output of active impedance 177 from the input signal to active impedance 177 to produce a high pass filter. An output capacitor 184 serves to couple signals from an active impedance 187 connected to a ground 173 and placed on an output 179. An active impedance 188 connected to a ground 173 functions as part of an impedance network connected to an input of operational amplifier 181. Active impedance 188 is controlled by a frequency sampling control signal generated by a sample signal generator circuit such as that shown in FIG. 16, and applied to control signal input 178. A node 174 is set at VCC/2. A resistor 180 is connected between the non-inverting input of operational amplifier 172 and node 174. Operational amplifiers 172 and 181 have a supply voltage of VCC.

Active impedance 187 is added to the feedback loop of amplifier 181. Active impedance 187 is controlled by a frequency sampling control signal generated by a sample signal generator circuit such as that shown in FIG. 16, and applied to control signal input 178. When active impedance 187 is made equal to active impedance 188, amplifier 181 is established as a balanced difference amplifier at any sample frequency.

For the circuit illustrated by FIGS. 11 and 12, the pass band is varied by adjusting the sample pulse width (width of Fsample). Experiments have confirmed that the pass band can be adjusted from several octaves to virtually 1 Hz resolution. In addition, the circuit is generally very stable. However, like any bandpass constructed from passive, resistors, capacitors or switched capacitors, the circuit oscillates if Q is too good.

The characteristics of the pass band filter design shown in FIG. 11 and FIG. 12 are as follows: The center frequency is determined by the sample frequency (Fsample) and the sample pulse width (Fsample width). The bandwidth is determined by the sample pulse width (Fsample width) and is inversely proportional to the sample pulse width. A bandwidth equal to 1 Hz is possible at almost any center frequency from DC to Fsample/2. At any resonant frequency, with the bandwidth equal to 1 Hz, the output wave form of the bandpass filter will be a square wave. Unlike the filter of FIG. 9, the peak output amplitude at resonance, with a bandwidth approaching 1 Hz, may exceed the peak input amplitude of that sampled signal (hence the filter has a gain greater than "1"). Once bandwidth performance of 1 Hz occurs at any center frequency, further adjustment of the filter, attempting to resolve a bandwidth of less than 1 Hz, will cause the filter to approach infinite gain causing the filter to oscillate and lock on that frequency.

Figure 13:
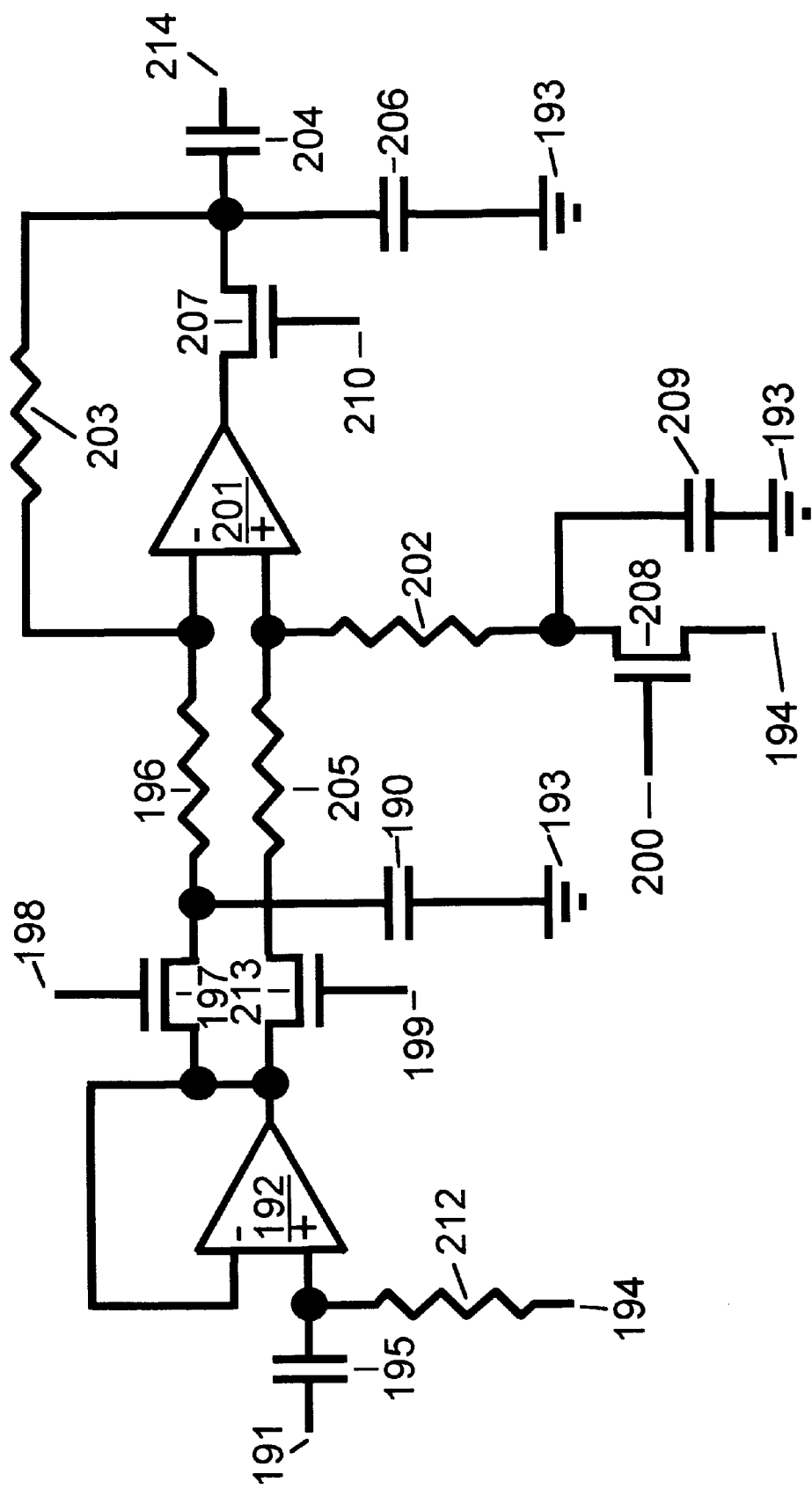
FIG. 13 is a balanced analog sampling non-inverting bandpass filter with independent or asynchronous sampling signal inputs in accordance with a preferred embodiment of the present invention.

FIG. 13 shows a working embodiment of an analog sampling non-inverting bandpass filter in accordance with a preferred embodiment of the present invention. A gate 197 is controlled by a frequency sampling control signal generated by a signal generator circuit (for example, as shown in FIG. 16) and applied to the gate control input at node 198. A capacitor 190, connected to a ground 193, is used to hold a sample of an output signal from gate 197. An operational amplifier 192 acts as a buffer to receive an input signal on an input 191 and forwards the input signal to gate 197. An input capacitor 195 serves to couple input 191 to operational amplifier 192. The output signal from gate 197 is a low pass band of the input signal to gate 197. An operational amplifier 201 and four bias resistors 196, 202, 203 and 205 acts as a unity gain differential amplifier that subtracts the (low pass band) at the output of gate 197 from the signal at the input to gate 197 to produce a high pass filter. An output capacitor 204 serves to couple signals from gate 207 to an output 214. A gate 208 and a capacitor 209 function as part of an active impedance network connected to an input of operational amplifier 201. Gate 208 is controlled by the frequency sampling control signal generated by a second sample signal generator circuit (with the design, for example, as shown in FIG. 16) and applied to node 200. A node 194 is set at VCC/2. A resistor 212 is connected between the non-inverting input of operational amplifier 192 and node 212. Operational amplifiers 192 and 201 have a supply voltage of VCC.

A gate 207 and a capacitor 206 are added to the feedback loop of amplifier 201. Gate 207 is controlled by a third frequency sampling control signal generated by another sample signal generator circuit (for example, as shown in FIG. 16) and applied to node 210. Additionally shown in FIG. 13 is a resistor 212 and a gate 213. Gate 213 is controlled by a fourth frequency sampling control signal generated by another sample signal generator circuit (for example, as shown in FIG. 16) and applied to node 199.

For the bandpass design shown in FIG. 13, a gain at resonance of greater than one is possible. This circuit also allows for different sampling pulse widths and frequencies to be used. In other words there can be four individual and asynchronous Fsample signals applied to control inputs 198, 199, 200 and 210 in order to permit fully independent adjustment of the high pass frequency and cutoff frequency, center frequency and passband response characteristics.

As previously mentioned, each Fsample signal is produced by four individual sample signal generator circuits (for example, as shown in FIG. 16). Therefore these different Fsample signals respectively control the sampling characteristics of each of gates 197, 213, 208 and 207 and in turn control the overall transfer function of the bandpass filter.

Capacitor 195 has a capacitance, for example, of 22 microfarads. Capacitor 204 has a capacitance of 22 microfarads. Capacitor 190 has a capacitance of 0.047 microfarads. Capacitor 209 has a capacitance of 0.047 microfarads. Capacitor 206 has a capacitance of 0.047 microfarads. VCC is at 5 volts. Ground 193 is at 0 volts. Node 194 is at 2.5 volts. Resistor 212 has a resistance of 10 kilohms. Resistor 205 has a resistance of 1 megohm. Resistor 202 has a resistance of 1 megohm. Resistor 203 has a resistance of 1 megohm. Resistor 196 has a resistance of 1 megohm.

Figure 14:
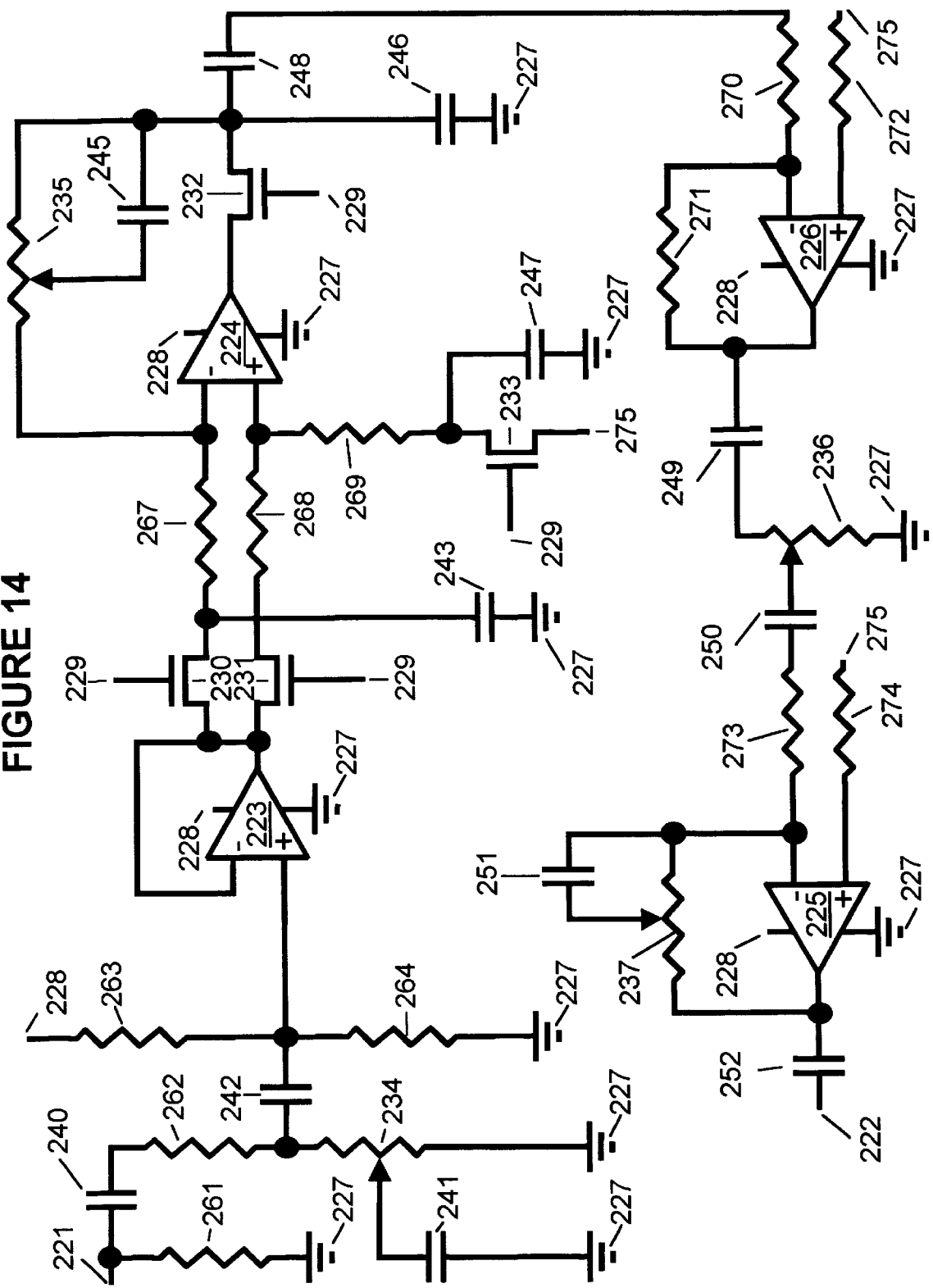
FIG. 14 is a balanced analog sampling bandpass filter with synchronous sampling signal inputs and passive integration control in accordance with a preferred embodiment of the present invention.

FIG. 14 shows a working embodiment of an analog sampling bandpass filter with signal integration in accordance with a preferred embodiment of the present invention. An input 221 receives an input signal. The circuit places an output signal on an output 222. The circuit includes an operational amplifier 223, an operational amplifier 225, an operational amplifier 226, an operational amplifier 224, a gate 230, a gate 231, a gate 232, a gate 233, a variable resistor 234, a variable resistor 235, a variable resistor 236, and a variable resistor 237 connected as shown. VCC 228 is set at five volts. A ground 227 is set at 0 volts. A frequency sampling control signal (Fsample) is generated by a sample signal generator circuit such as that shown in FIG. 16 and applied to node 229.

A capacitor 240 has a value of 22 microfarads. A capacitor 241 has a value of 0.2 microfarads. A capacitor 242 has a value of 22 microfarads. A capacitor 243 has a value of 0.047 microfarads. A capacitor 245 has a value 47 picofarads. A capacitor 246 has a value of 0.047 microfarads. A capacitor 247 has a value of 0.047 microfarads. A capacitor 248 has a value of 0.4 microfarads. A capacitor 249 has a value of 4.7 microfarads. A capacitor 250 has a value of 4.7 microfarads. A capacitor 251 has a value of 0.001 microfarads. A capacitor 252 has a value of 22 microfarads.

A resistor 261 has a resistance of 47 kilohms. A resistor 262 has a resistance of 100 kilohms. A resistor 263 has a resistance of 20 kilohms. A resistor 264 has a resistance of 20 kilohms. A resistor 267 has a resistance of 1 megohm. A resistor 268 has a resistance of 1 megohm. A resistor 269 has a resistance of 1 megohm. A resistor 270 has a resistance of 330 kilohms. A resistor 271 has a resistance of 1 megohm. A resistor 272 has a resistance of 1 megohm. A resistor 273 has a resistance of 470 kilohms. A resistor 274 has a resistance of 1 megohm. A voltage of VCC/2 is connected to node 275.

Figure 15B:
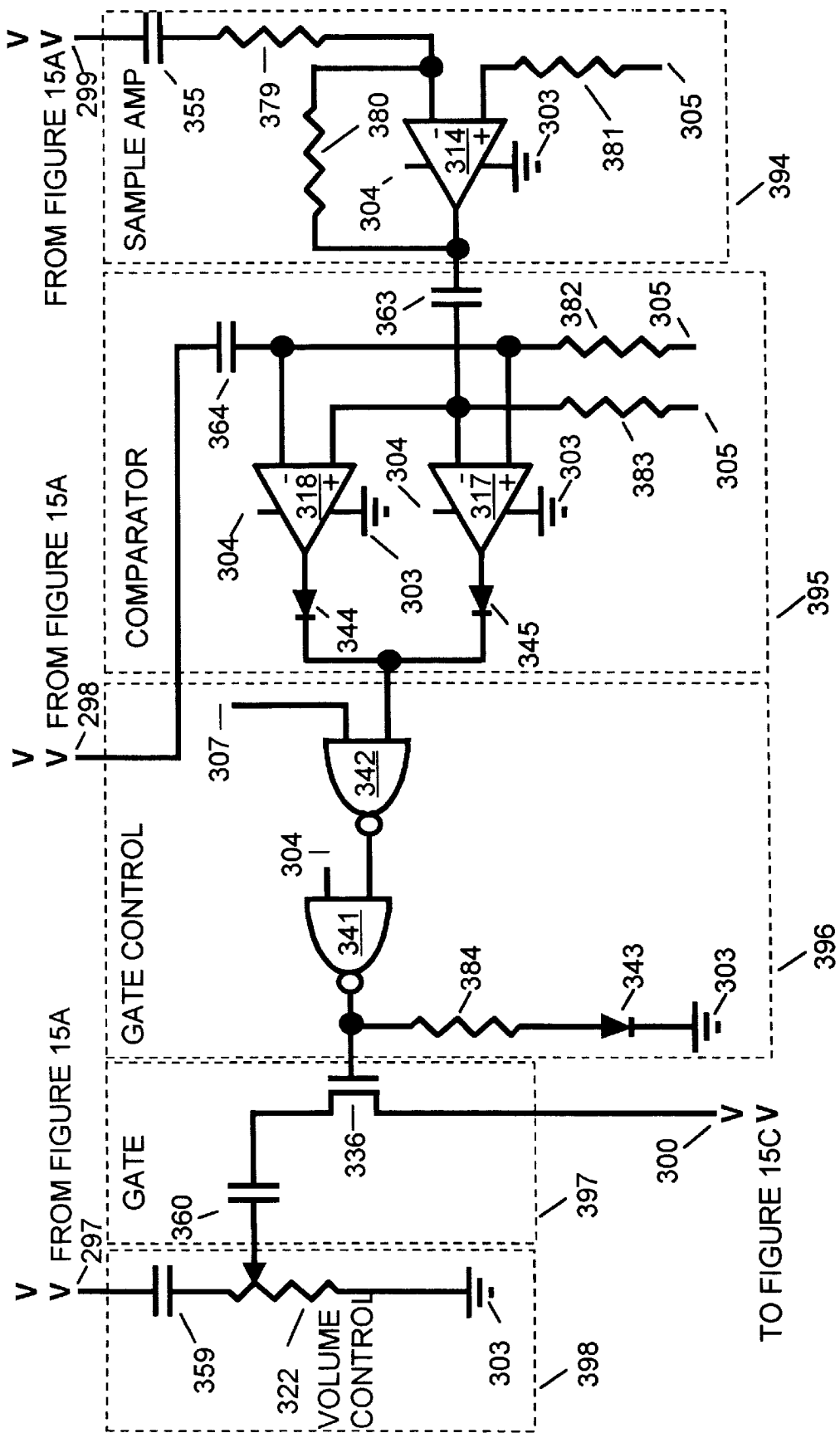
Figure 15C:
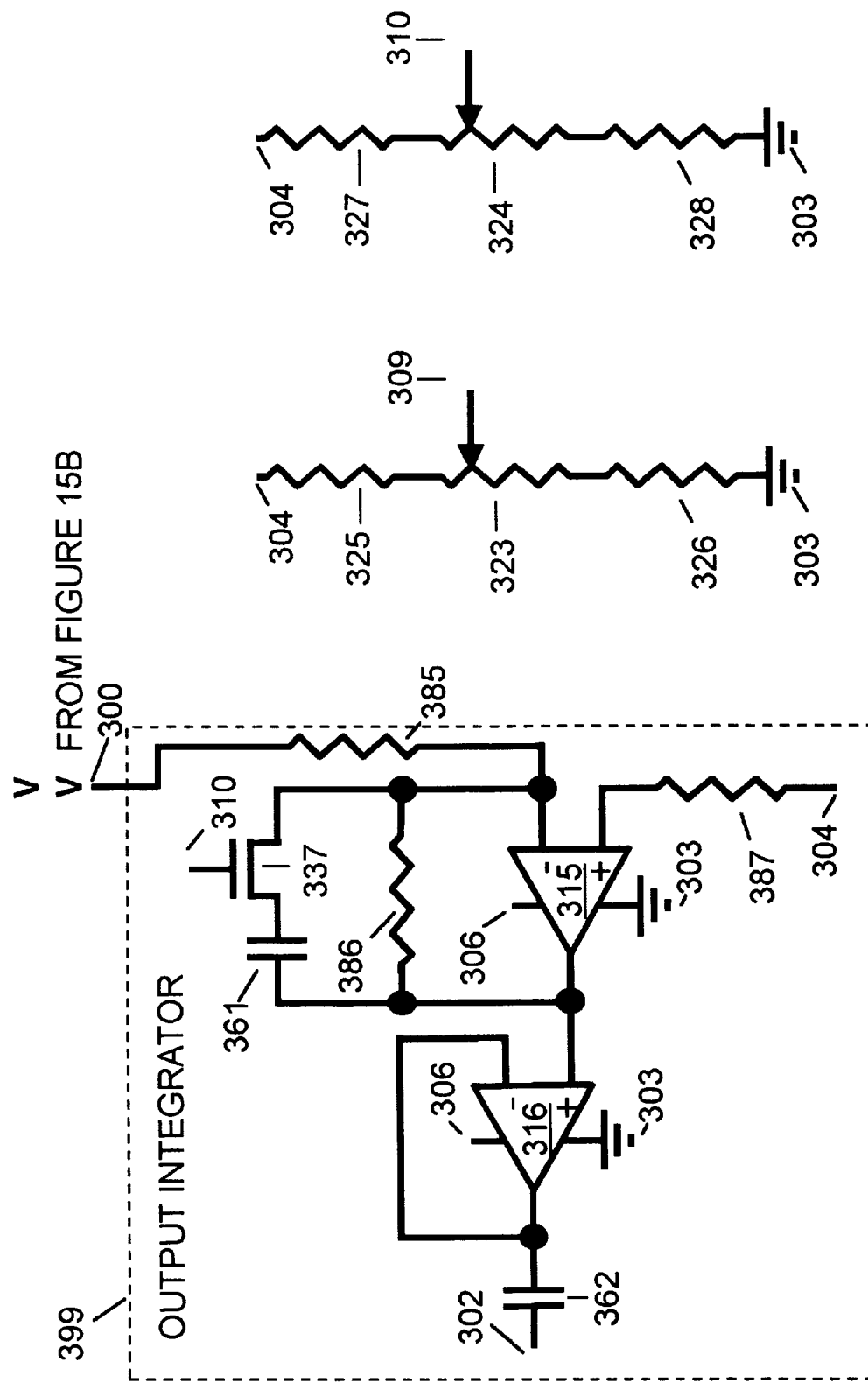

FIGS. 15A, 15B and 15C show a working embodiment of an analog sampling processor with a bandpass filter with active integration and sample gating in accordance with a preferred embodiment of the present invention. The processor includes an input buffer block 391, an input anti-alias block 392, an analog sampling bandpass filter 393, a sample amplifier 394, a comparator block 395, a gate control block 396, a gate block 397, a volume control block 398, and an output integrator 399.

An input 301 receives an input signal. The circuit places an output signal on an output 302. VCC 304 is set at five volts. A ground 303 is set at 0 volts. A bias voltage 305 is set at 2.5 volts. A supply voltage 306 is set at 10 volts. A frequency sampling control signal (Fsample) is generated by a sample signal generator circuit such as that shown in FIG. 16 and placed on a sample control input 308. Additionally, a second sampling control signal, generated by another sample signal generator circuit such as that shown in FIG. 16, is placed on gate control input 307. The sampling control signal placed on input 307 is used to control resampling of specific signals with frequencies within the overall frequency passband determined by the analog sampling bandpass filter of block 393. Hence enabling further resolution of a desired signal and it's harmonic content. An integration control voltage 309 controls sample integration. An integration control voltage 310 is used to control the smoothing of the output signal.

The circuit includes an operational amplifier 311, an operational amplifier 312, an operational amplifier 313, an operational amplifier 314, an operational amplifier 315, an operational amplifier 316, a comparator 317, a comparator amplifier 318, a variable resistor 321, a variable resistor 322, a variable resistor 323, a variable resistor 324, a gate 331, a gate 332, a gate 333, a gate 334, a gate 335, a gate 336, a gate 337, a logical NAND gate 341, a logical NAND gate 342, a light emitting diode 343, a diode 344 and a diode 345 connected as shown.

A capacitor 351 has a value of 22 microfarads. A capacitor 352 has a value of 22 microfarads. A capacitor 353 has a value of 0.2 microfarads. A capacitor 354 has a value of 5 to 47 micofarads. A capacitor 355 has a value of 22 microfarads. A capacitor 356 has a value of 0.047 microfarads. A capacitor 357 has a value of 0.047 microfarads. A capacitor 358 has a value of 0.047 microfarads. A capacitor 359 has a value of 22 microfarads. A capacitor 360 has a value of 22 microfarads. A capacitor 361 has a value of 0.001 microfarads. A capacitor 362 has a value of 22 microfarads. A capacitor 363 has a value of 22 microfarads. A capacitor 364 is 4.7 microfarads. A capacitor 365 is 4.7 microfarads.

A resistor 371 has a resistance of 47 kilohms. A resistor 372 has a resistance of 100 kilohms. A resistor 373 has a resistance of 100 kilohms. A resistor 374 has a resistance of 10 kilohms. A resistor 375 has a resistance of 1 megohms. A resistor 376 has a resistance of 1 megohms. A resistor 377 has a resistance of 1 megohms. A resistor 378 has a resistance of 1 megohms. A resistor 379 has a resistance of 330 kilohms. A resistor 380 has a resistance of 1 megohm. A resistor 381 has a resistance of 1 megohm. A resistor 382 has a resistance of 10 kilohms. A resistor 383 has a resistance of 10 kilohms. A resistor 384 has a resistance of 1 kilohm. A resistor 385 has a resistance of 330 kilohms. A resistor 386 has a resistance of 1 megohm. A resistor 387 has a resistance of 1 megohm. All variable resistors 321, 322, 323 and 324 have resistances of 250 kilohms. Resistors 325, 326, 327 and 328 have resistances of 82 kilohms.

FIG. 16 shows a sample signal generator circuit. The frequency sampling control signal generator utilizes two TLC555 timer chips from Texas Instruments. Timer 404 is the first TLC555 timer chip. Timer 405 is the second TLC555 timer chip. Transistors 406 and 407 are included in a single CD4007 CMOS chip from National Semiconductor. A VCC 402 is at 5 volts. A ground 403 is at 0 volts. An output is placed on output 401. A variable resistor 408 is used for coarse adjustment of the frequency of the output signal. A variable resistor 409 is used for fine adjustment of the frequency of the output signal. A variable resistor 410 is used to adjust the pulse width of the output signal. The adjustment of resistors 408, 409, and 410 are field programmable. Resistors 408, 409, and 410 may also be replaced by digital to analog converters (DACs) hence enabling digital control of the output frequency and output pulse width.

A capacitor 411 has a value of 5 picofarads. A capacitor 412 has a value of 5 picofarads. A capacitor 413 has a value of 0.1 microfarads. A capacitor 414 has a value of 0.1 microfarads.

A resistor 415 has a resistance of 56 kilohms. A resistor 416 has a resistance of 1 kilohm. A resistor 417 has a resistance of 82 kilohms. A resistor 418 has a resistance 82 kilohms. A resistor 419 has a resistance of 82 kilohms. A resistor 420 has a resistance of 1 kilohm. A resistor 408 has resistance of 250 kilohms. A resistor 410 has a resistance of 250 kilohms.

The present invention can be implemented using various integrated circuit technologies. For example, FIGS. 17 through 26 show how various filters can be constructed using CMOS technology in accordance with various embodiments of the present invention. All CMOS devices shown in FIGS. 17 through 26 are powered by a VCC equal to five volts (+5v).

Figure 17:
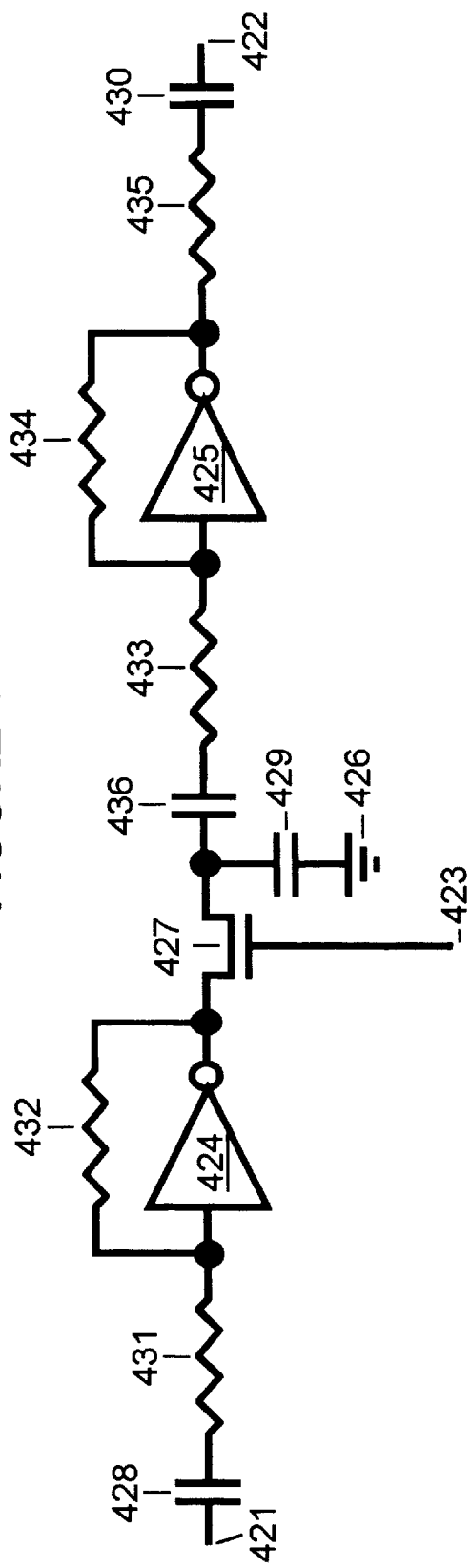
FIG. 17 is a low pass filter implemented using CMOS technology in accordance with a preferred embodiment of the present invention.

FIG. 17 shows a non-inverting analog sampling low pass filter. The analog sampling low pass filter has an input 421, an output 422, a frequency sampling control signal from a sample signal generator circuit FIG. 16 placed on input 423 of gate 427, a logical inverter gate 424, a logical inverter gate 425, a ground 426, a gate 427, a capacitor 428, a capacitor 429, a capacitor 430, capacitor 436, a resistor 431, a resistor 432, a resistor 433, a resistor 434, and a resistor 435 connected as shown.

Figure 18:
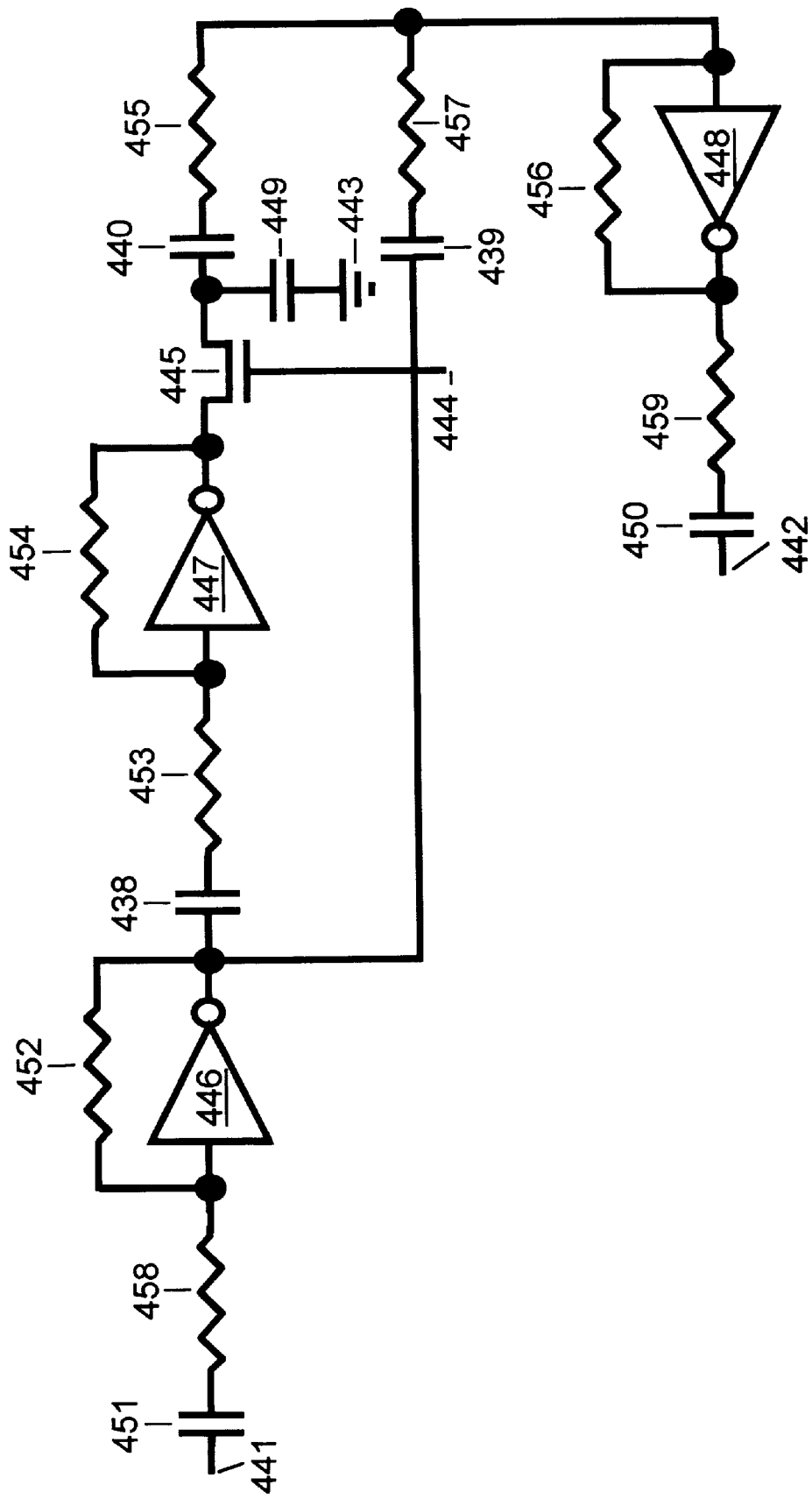
FIG. 18 is a high pass filter implemented using CMOS technology in accordance with a preferred embodiment of the present invention.

FIG. 18 shows a non-inverting analog sampling high pass filter. The analog sampling high pass filter has an input 441, an output 442, ground 443, a frequency sampling control signal input node 444, gate 445 a logical inverter gate 446, a logical inverter gate 447, a logical inverter gate 448, a capacitor 438, a capacitor 439, a capacitor 440, a capacitor 449, a capacitor 450, a capacitor 451, a resistor 452, a resistor 453 and a resistor 454, a resistor 455, a resistor 456, a resistor 457, a resistor 458, and a resistor 459 connected as shown.

Figure 19:
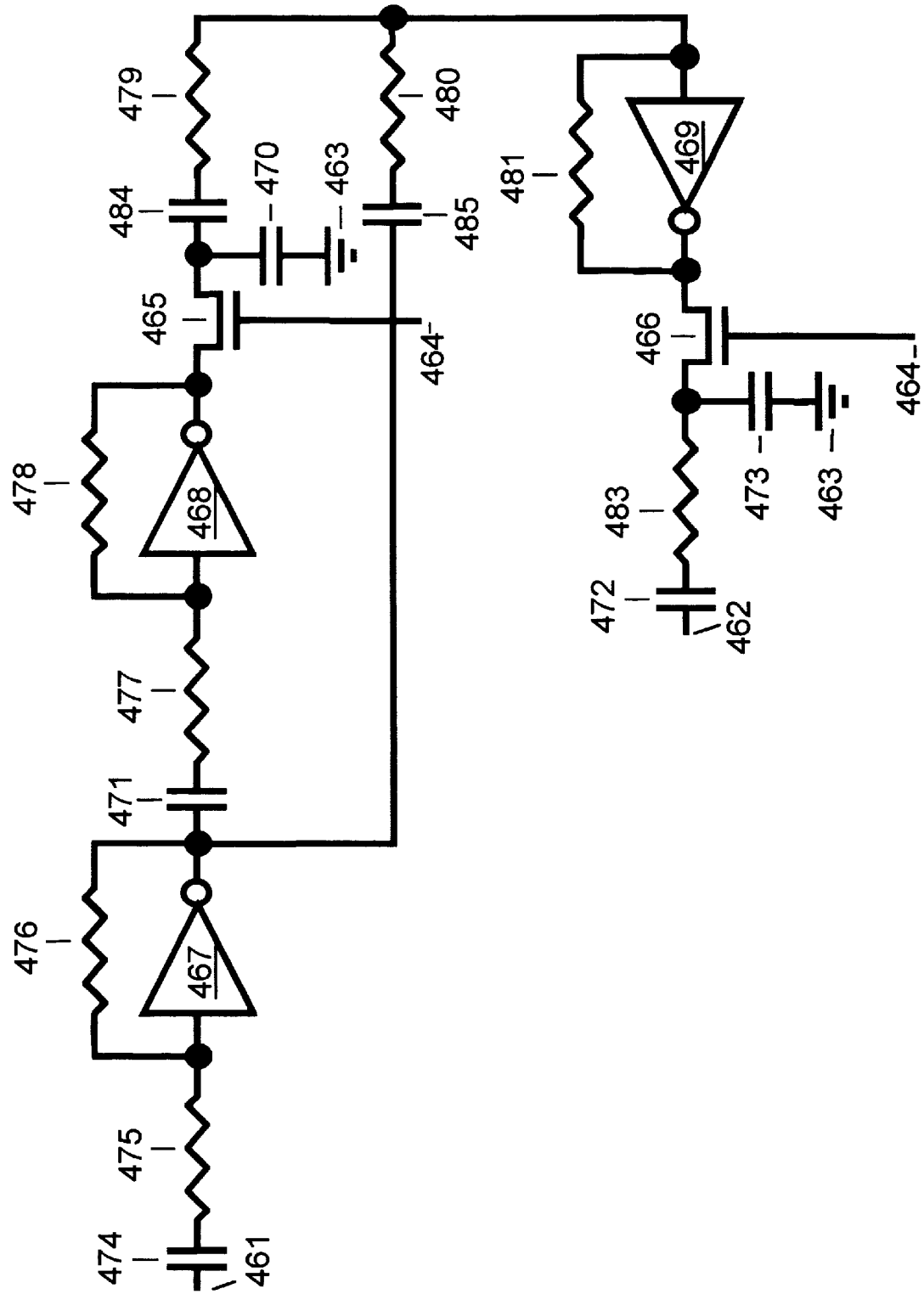
FIG. 19, FIG. 20, FIG. 21, FIG. 22, FIG. 23, FIG. 24 and FIG. 25 each show various bandpass filter implementations using CMOS technology in accordance with preferred embodiments of the present invention.

FIG. 19 shows an analog sampling bandpass filter with a gain at resonance less than or equal to one. As in the previous bandpass filters, the switching gates may be driven by independent sampling signals to achieve broader control of the filters transfer characteristics. For simplification, they are shown here connected to the same node for synchronous operation. The analog sampling bandpass filter has an input 461, an output 462, ground 463, a frequency sampling control signal input node 464, gate 465, a gate 466, a logical inverter gate 467, a logical inverter gate 468, a logical inverter gate 469, a capacitor 470, a capacitor 471, a capacitor 472, a capacitor 473, a capacitor 474, a capacitor 484, a capacitor 485, a resistor 475, a resistor 476, a resistor 477, a resistor 478, a resistor 479, a resistor 480, a resistor 481 and a resistor 483, connected as shown.

Figure 20:
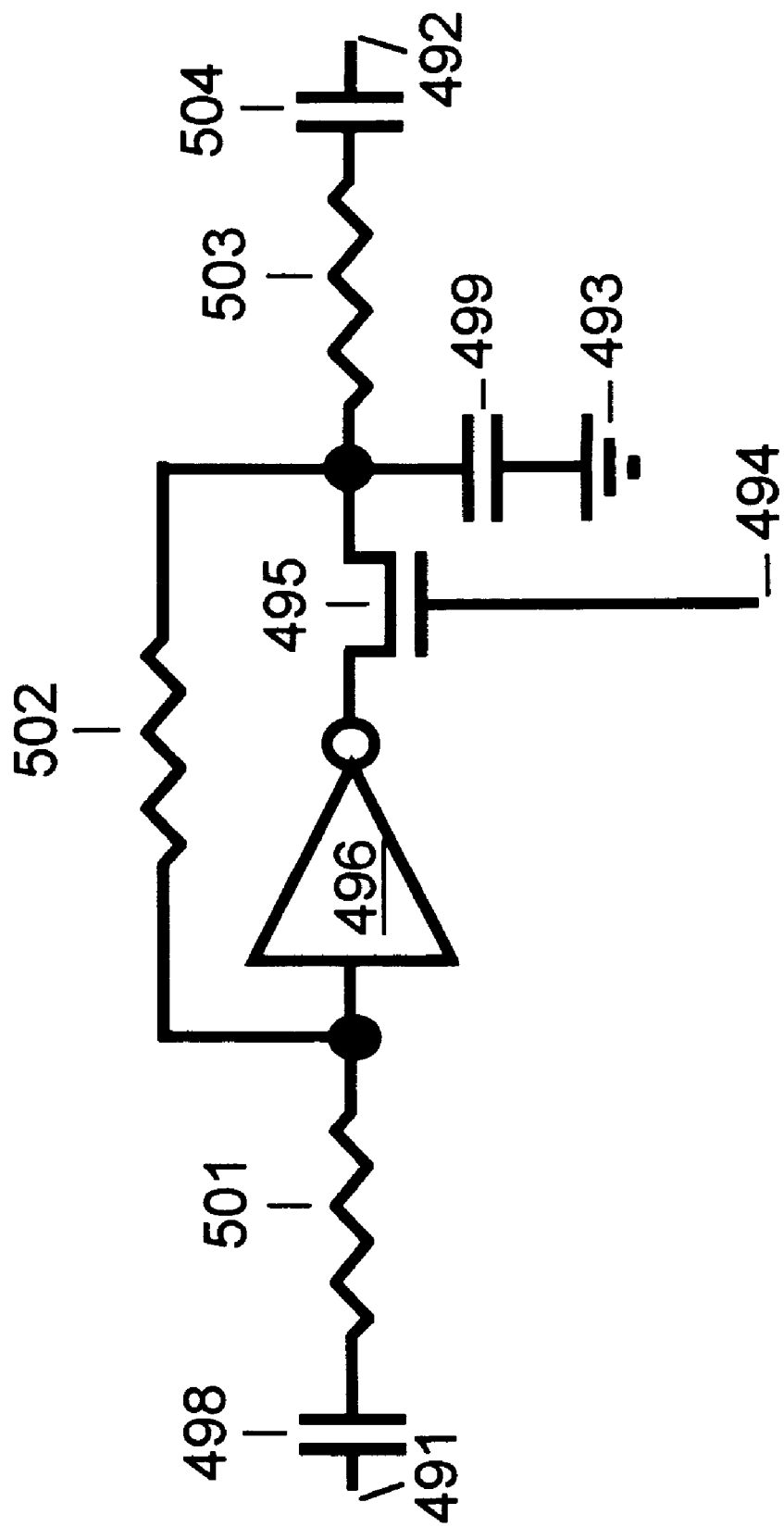

FIG. 20 shows another embodiment of an analog sampling bandpass filter with a gain greater than one possible at resonance. The analog sampling bandpass filter has an input 491, an output 492, ground 493, a frequency sampling control signal input node 494, a gate 495, a logical inverter gate 496, a capacitor 498, a capacitor 499, a capacitor 504, a resistor 501, and a resistor 502, and a resistor 503 connected as shown.

Figure 21:
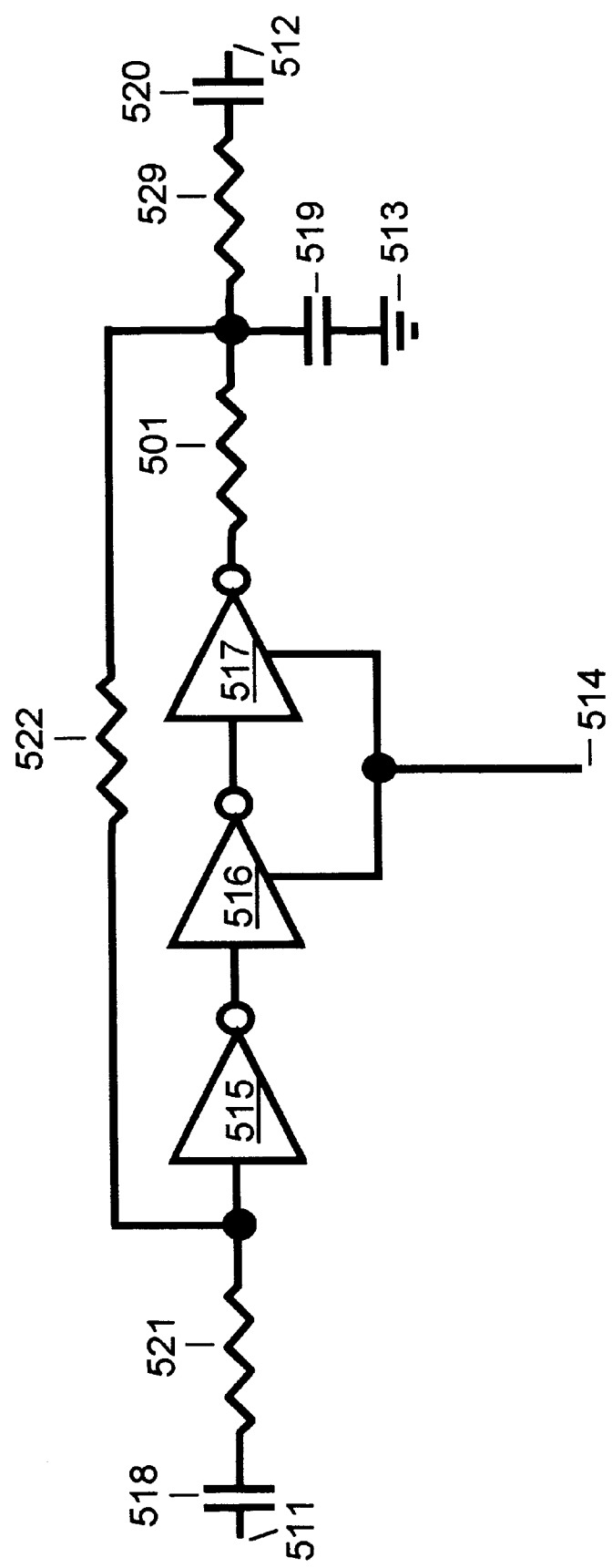

FIG. 21 shows another embodiment of an analog sampling bandpass filter with a gain greater than one possible at resonance. The analog sampling bandpass filter has an input 511, an output 512, ground 513, a frequency sampling control signal input node 514, a logical inverter 515, a logical tri-state inverter 516, a logical tri-state inverter 517, a capacitor 518, a capacitor 519, a capacitor 520, a resistor 501, a resistor 521, a resistor 522, and a resistor 529, connected as shown.

Figure 22:
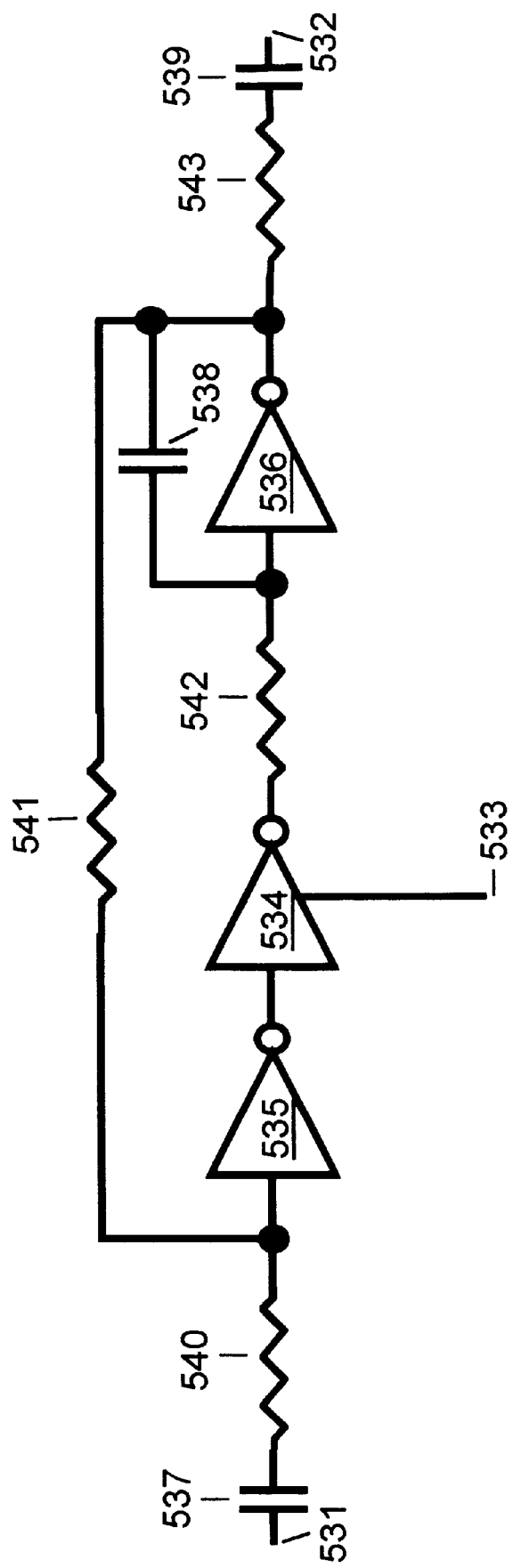

FIG. 22 shows another embodiment of an analog sampling bandpass filter. The analog sampling bandpass filter has an input 531, an output 532, a frequency sampling control signal input node 533, a logical tri-state inverter 534, a logical inverter 535, a logical inverter 536, a capacitor 537, a capacitor 538, a capacitor 539, a resistor 540, a resistor 541, a resistor 542, and a resistor 543 connected as shown. In this analog sampling bandpass filter, resistor 542, logical inverter 536 and capacitor 538 function as a virtual capacitor to work in conjunction with tri-state inverter 534 that functions as a gate.

Figure 23:
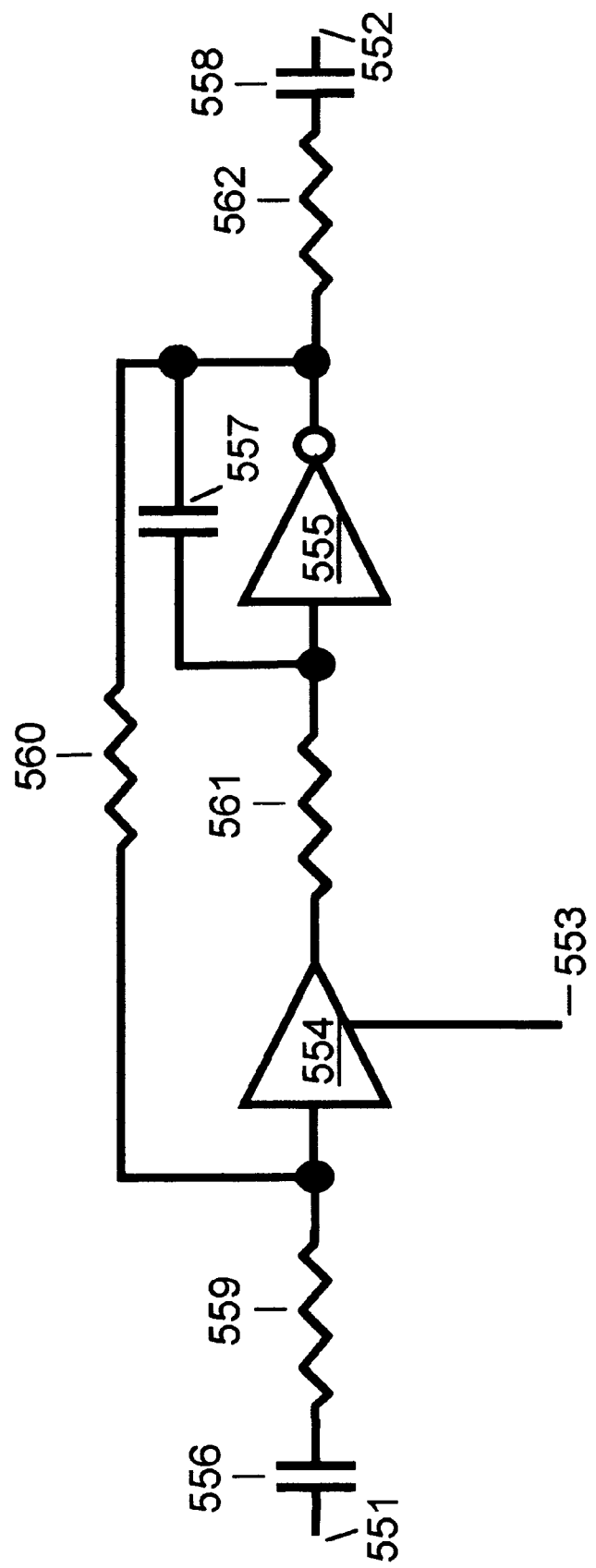

FIG. 23 shows another embodiment of an analog sampling bandpass filter similar to FIG. 22 but where inverters 535 and 534 are replaced by a non-inverting buffer 554. The analog sampling bandpass filter has an input 551, an output 552, a frequency sampling control signal input node 553, a tri-state buffer 554, a logical inverter 555, a capacitor 556, a capacitor 557, a capacitor 558, a resistor 559, a resistor 560, a resistor 561, and a resistor 562 connected as shown. This analog sampling bandpass filter is similar to the circuit shown in FIG. 22 with tri-state buffer 554 taking the place of tri-state inverter 534 and inverter 535.

Figure 24:
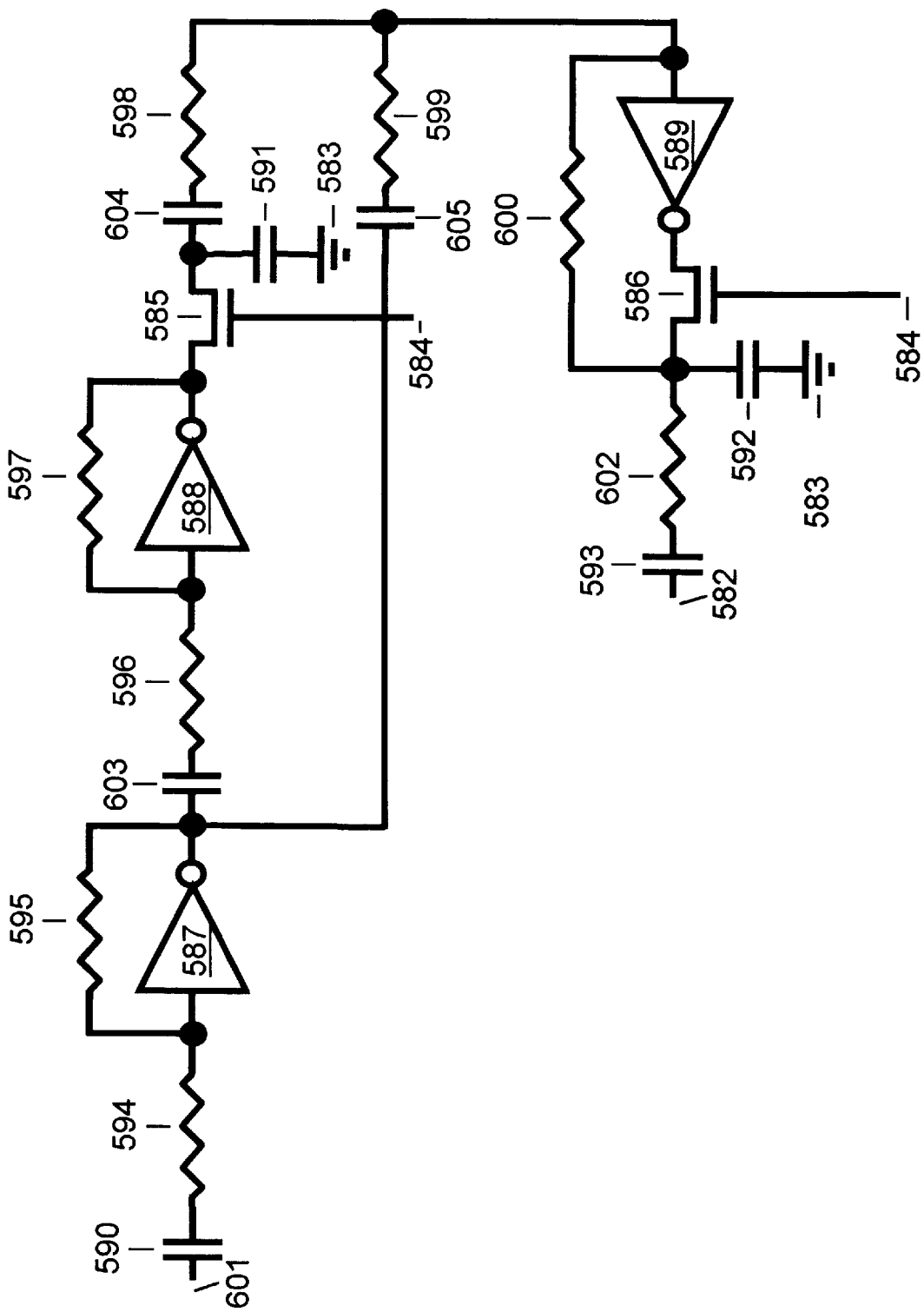

FIG. 24 shows an analog sampling bandpass filter with a gain greater than one possible at resonance. As in the previous bandpass filters, the switching gates may be driven by independent sampling signals to achieve broader control of the filters transfer characteristics. For simplification, they are shown here connected to the same node for synchronous operation. The analog sampling band pass filter has an input 601, an output 582, a ground 583, a frequency sampling control signal input node 584, a gate 585, a gate 586, a logical inverter 587, a logical inverter 588, a logical inverter 589, a capacitor 590, a capacitor 591, a capacitor 592, a capacitor 593, a capacitor 603, a capacitor 604, a capacitor 605, a resistor 594, a resistor 595, a resistor 596, a resistor 597, a resistor 598, a resistor 599, a resistor 600, and a resistor 602, connected as shown.

Figure 25:
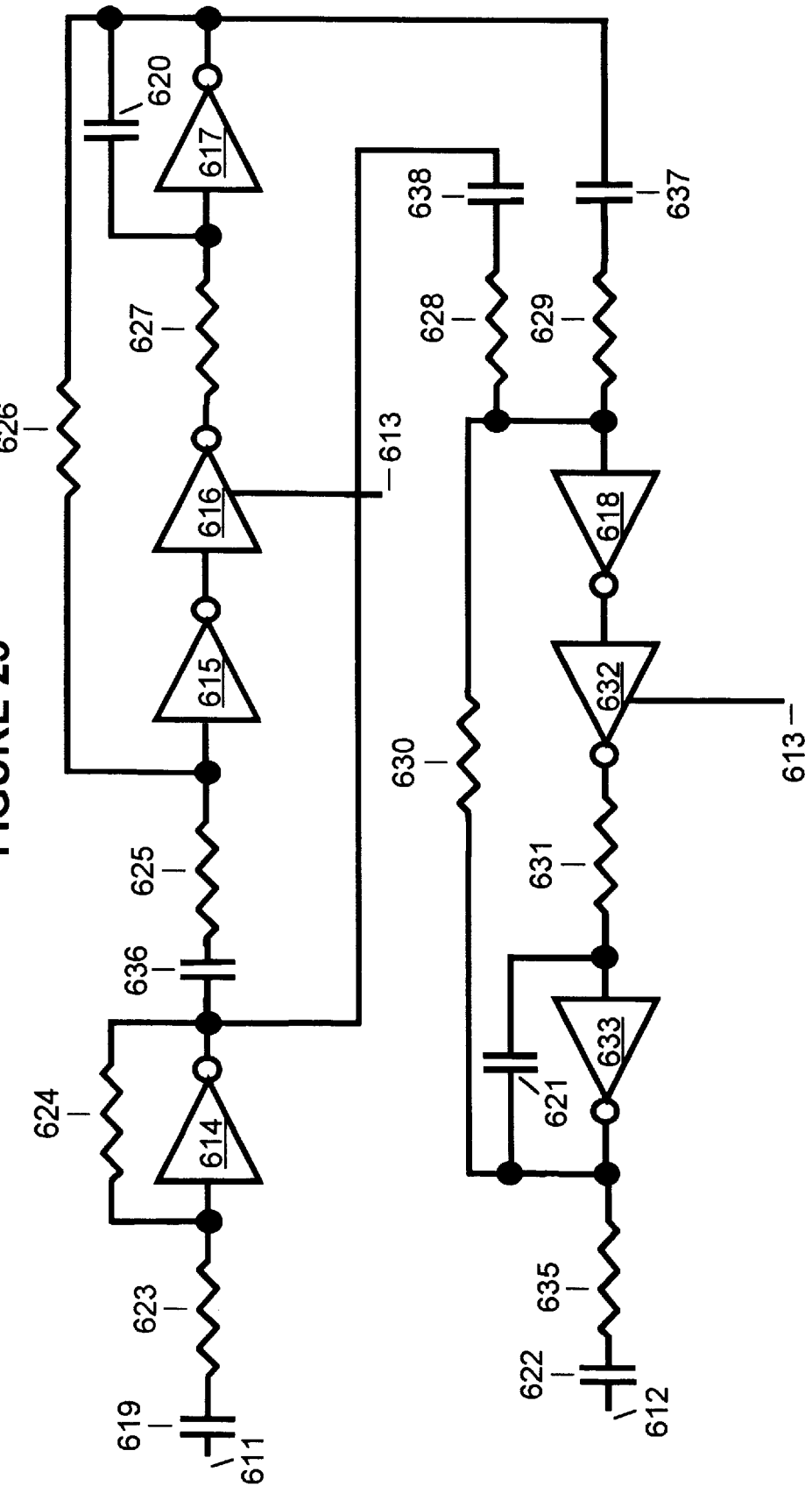

FIG. 25 shows an analog sampling bandpass filter similar to FIG. 24 but where tri-stateable inverters replace gates. The analog sampling bandpass filter has an input 611, an output 612, a frequency sampling control signal input node 613, a logical inverter 614, a logical inverter 615, a tri-stateable inverter 616, a logical inverter 617, a logical inverter 618, a tri-stateable inverter 632, a logical inverter 633, a capacitor 619, a capacitor 620, a capacitor 621, a capacitor 622, a capacitor 636, a capacitor 637, a capacitor 638, a resistor 623, a resistor 624, a resistor 625, a resistor 626, a resistor 627, a resistor 628, a resistor 629, a resistor 630, a resistor 631, and a resistor 635 connected as shown.

Figure 26:
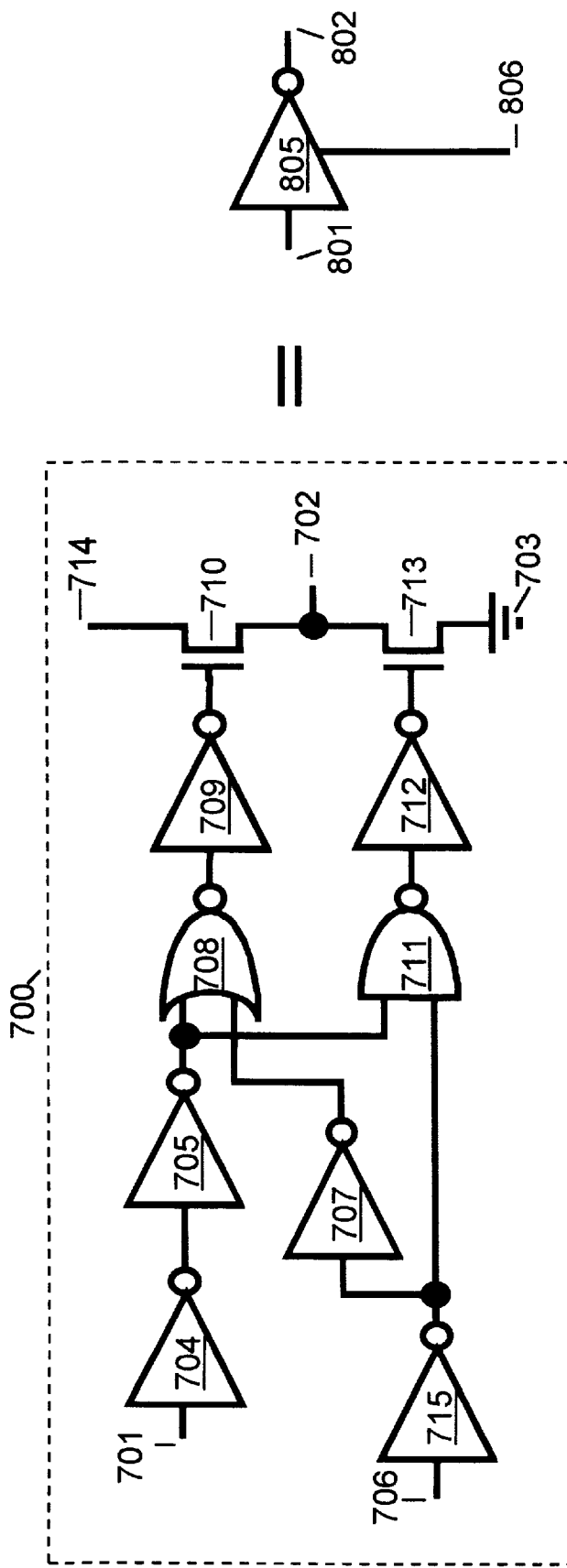
FIG. 26 shows a schematic diagram of a tri-stateable CMOS inverter in accordance with preferred embodiments of the present invention.

FIG. 26 shows a CMOS tri-state inverter 805 having an input 801, an output 802 and a gate input 806. A gate level implementation, block 700, of CMOS tri-state inverter 805 is also shown. Gate level implementation 700 includes CMOS inverter 704, a CMOS inverter 705, a CMOS inverter 707, a CMOS inverter 709, a CMOS inverter 712, a CMOS inverter 715, a CMOS NOR gate 708 and a CMOS NAND gate 711. In addition a transistor 710 and a transistor 713 are connected between a ground 703 and a VCC 714 as shown. An input 701 is functionally equivalent to input 801. A tri-state control input 706 is functionally equivalent to input 806. An output 702 is functionally equivalent to output 802.

In the CMOS analog sampling filter implementations discussed above, tri-stateable CMOS inverters configured as inverting linear amplifiers are equivalent to an inverting analog switch. This is illustrated by FIG. 27.

Figure 27:
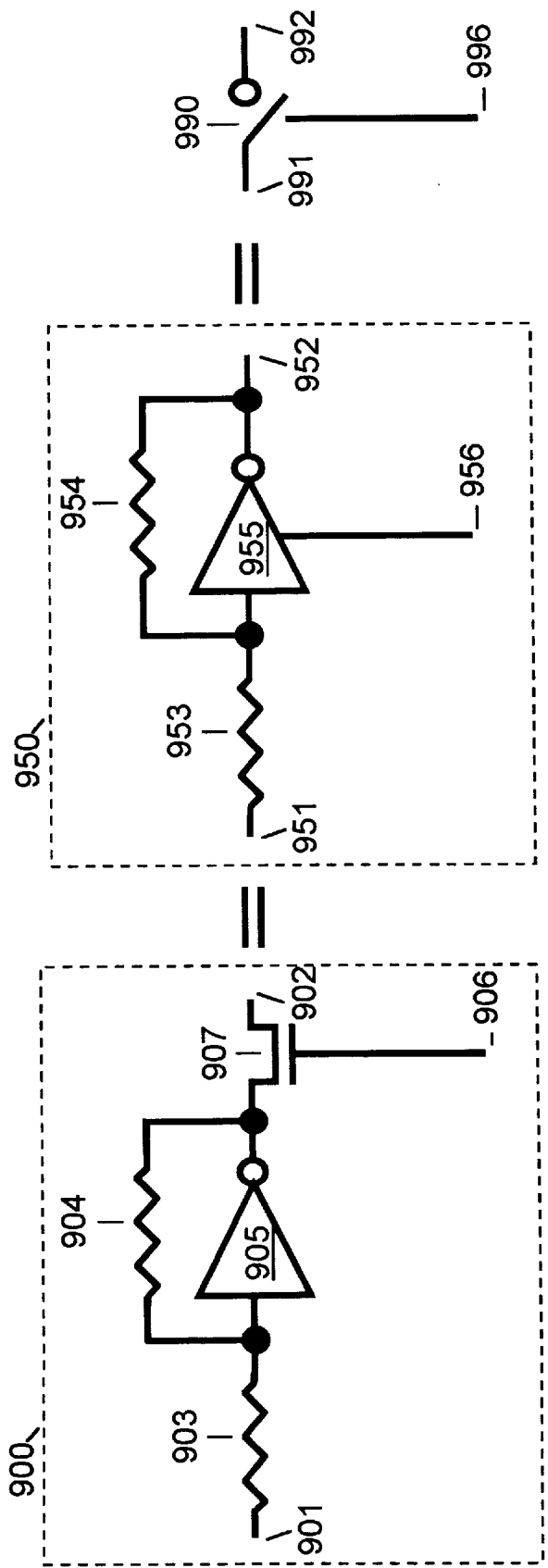
FIG. 27 shows the relationship between a gated linear biased inverter, a tri-stateable CMOS inverter configured as an inverting analog switch and the symbolic representation of an ideal inverting analog switch in accordance with preferred embodiments of the present invention.

FIG. 27 shows a symbol for an inverting analog switch 990 that has an input 991, an output 992 and a control input 996. Unlike a true bilateral switch, the analog switch 990 is unidirectional and is implemented, for example, using a CMOS tri-state inverter 955, a resistor 953 and a resistor 954, as shown within a block 950. In this functionally equivalent circuit, an input 951 is functionally equivalent to input 991, an output 952 is functionally equivalent to output 992, and a control input 956 is functionally equivalent to control input 996.

Another functionally equivalent circuit to analog switch 990 is shown in block 900. This equivalent circuit includes a CMOS inverter 905, a resistor 903, a resistor 904, and a transistor 907. In this functionally equivalent circuit, an input 901 is functionally equivalent to input 991, an output 902 is functionally equivalent to output 992, and a control input 906 is functionally equivalent to control input 996.

An advantage with the circuit of block 950 over the circuit of block 900, is that the circuit of block 950 significantly reduces signal distortion arising when switched voltages exceed 0.6volts (peak to peak). This distortion commonly occurs in a conventional CMOS bi-lateral switch (as implemented by transistor 907) due to drain to source channel resistance (Rds) modulation as a function of drain to source voltages (Vds). The source is considered as the input to transistor 907 (hence the output of 905) and the drain is considered to be the output 902. A tri-stateable logical inverter such as CMOS tri-state inverter 955 has no series resistance. The only resistances in this circuit are resistances 953 and 954 that are typically 10 megohms or greater and do not modulate in value with the voltage drop across them. In essence, CMOS tri-state inverter 955, with resistors 953 and 954 connected as shown, is a new logic element in which the non-linear series Rds of a bilateral switch is absent and a more ideal switch has been created.

Figure 28:
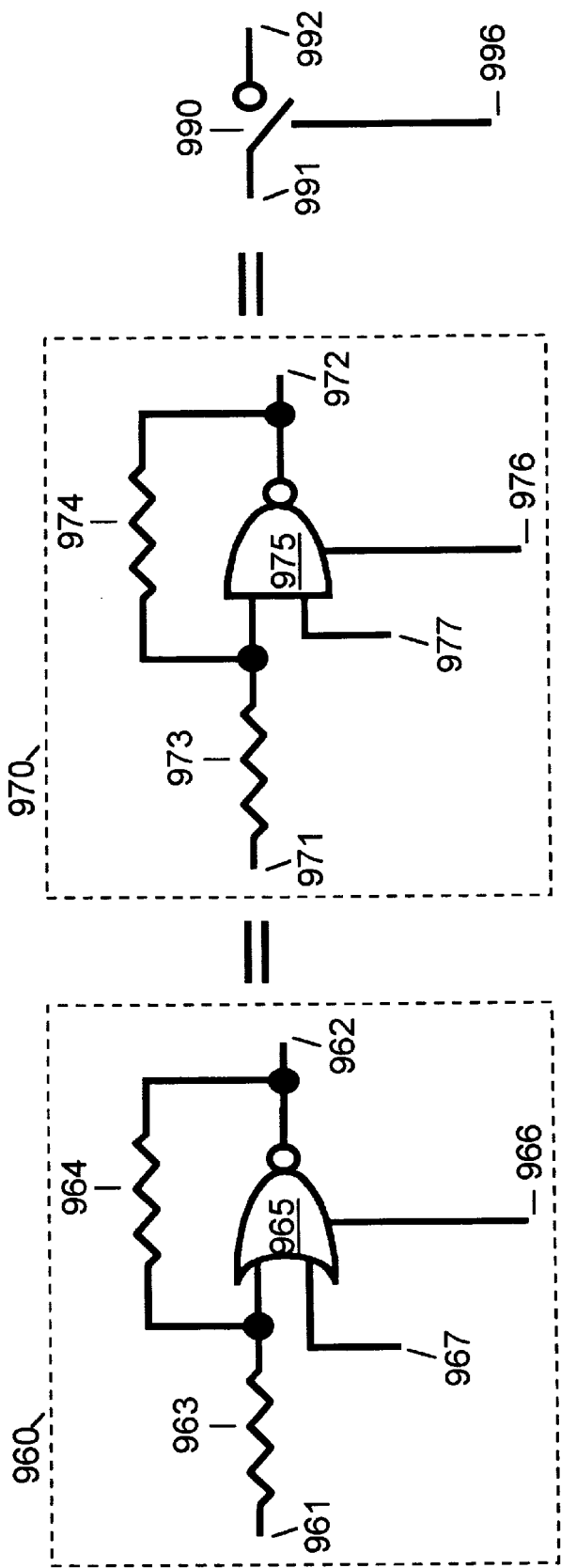
FIG. 28 shows the relationship between a tri-stateable CMOS NOR gate configured as an inverting analog switch, a tri-stateable CMOS NAND gate configured as an inverting analog switch and the symbolic representation of an ideal inverting analog switch in accordance with preferred embodiments of the present invention.

FIG. 28 shows the symbol for inverting analog switch 990 which has input 991, output 992 and control input 996.

One hardware implementation of analog switch 990 is shown by a block In this implementation, the resulting analog switch is unidirectional. The analog switch implementation includes a CMOS tri-state NOR gate 965, a resistor 963 and a resistor 964, as shown in block 960. Input 967 is set to 0.0 volts (or ground). In this functionally equivalent circuit, an input 961 is functionally equivalent to input 991, an output 962 is functionally equivalent to output 992, and a control input 966 is functionally equivalent to control input 996.

Additionally, FIG. 28 shows another hardware implementation of analog switch 990 in a block 970. This hardware implementation includes a CMOS tri-state NAND gate 975, a resistor 973 and a resistor 974, as shown within block 970. Input 977 is set to 5.0 volts (or VCC). In this functionally equivalent circuit, an input 971 is functionally equivalent to input 991, an output 972 is functionally equivalent to output 992, and a control input 976 is functionally equivalent to control input 996.

Figure 29:
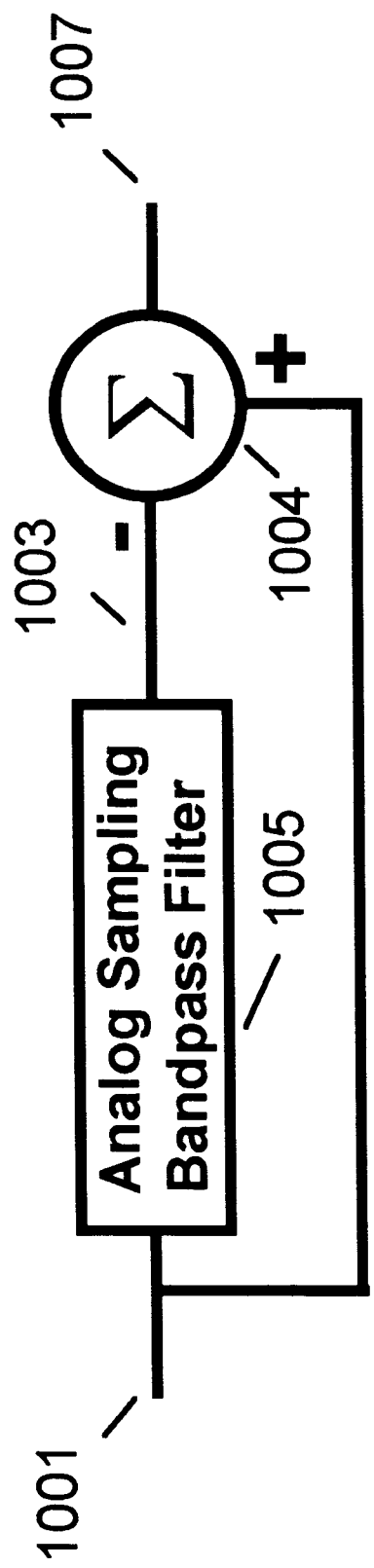
FIG. 29 shows a simplified block diagram of a notch filter in accordance with a preferred embodiment of the present invention.

FIG. 29 shows a simplified block diagram of a notch filter. An input signal is received on an input 1001. An analog sampling bandpass filter 1005 and a summer 1003 implement a notch filter. Analog sampling bandpass filter 1005 filters the input signal to produce a filtered signal on an output 1003. Summer 1004 subtracts the filtered signal on output 1003 from input 1001 and places the result on a circuit output 1007.

A notch filter rejects a band of frequencies around a particular center frequency. For example, a notch filter is what results when the output signal of a bandpass filter is subtracted from its input signal. The input signal is composed of any frequency possible.

Essentially, an analog sampling notch filter can be built from the filters disclosed herein. For example, the frequency response graph in FIG. 3 of an analog sampling Low Pass filter, as shown in FIG. 3, has a "Comb" like characteristic shape; with notches between Fs/2, Fs, 2Fs, and 4Fs etc. In these notches the low pass filter has 100% rejection and will not pass these input frequencies to the output. Therefore FIG. 3, illustrates a Comb Filter according to Nyquist.

The analog sampling non-inverting high pass filter shown in FIG. 8, also implements a Comb Filter; with Notches possible at Fs/2, Fs, 2Fs, and 4Fs etc. Hence notches occur at the sample frequency divided by 2, the sample frequency itself and every harmonic of the sample frequency thereafter. Unlike conventional Notch filters, by reducing the sample pulse width the harmonics can be "rolled off" or attenuated as desired as discussed above.

Figure 30:
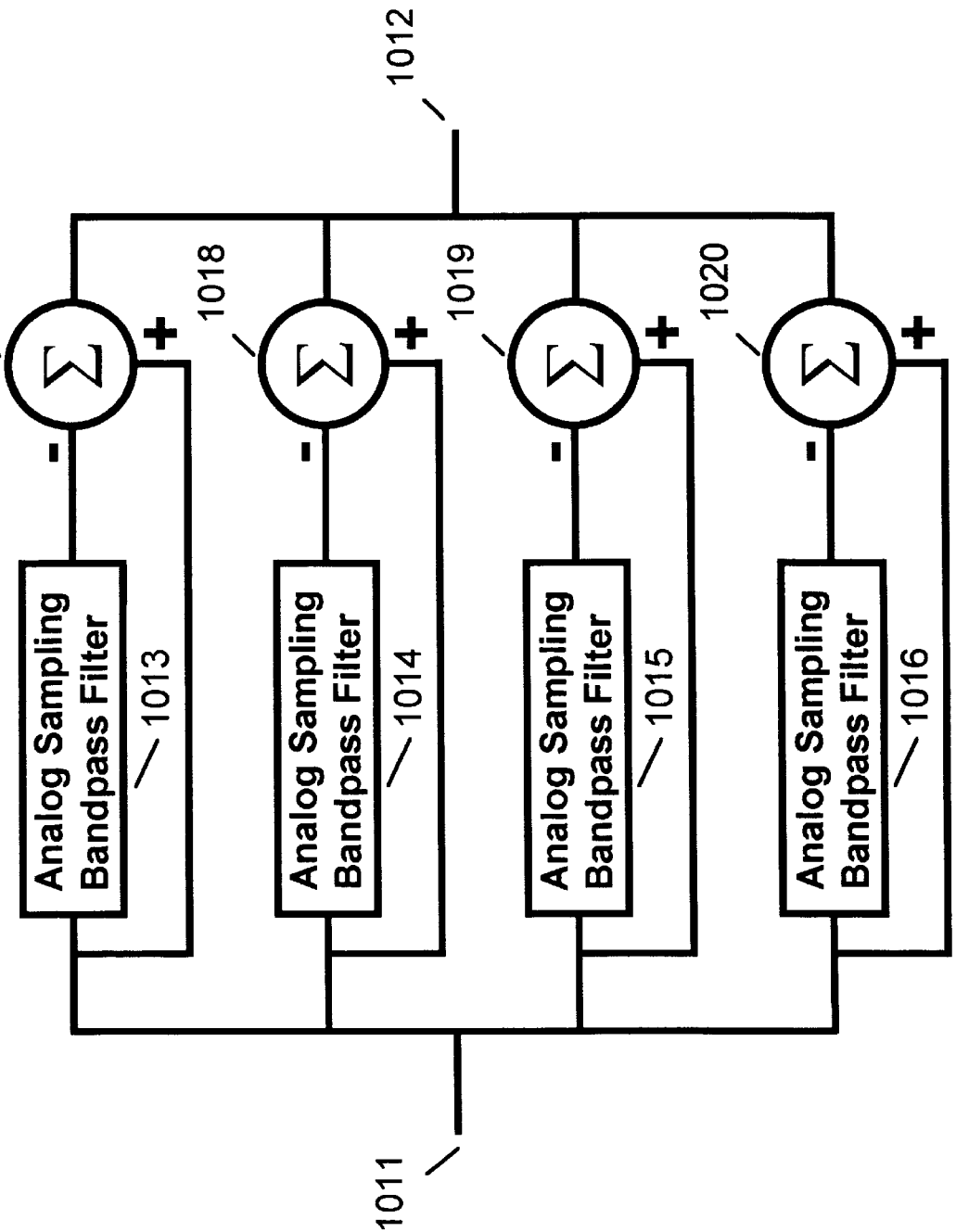
FIG. 30 is a block diagram showing a comb filter implemented using notch filters in accordance with a preferred embodiment of the present invention.

FIG. 30 is a block diagram showing a comb filter implemented using notch filters, as described above, connected in parallel. An input signal is received on an input 1011. An analog sampling bandpass filter 1013 and a summer 1017 implement a first notch filter. An analog sampling bandpass filter 1014 and a summer 1018 implement a second notch filter. An analog sampling bandpass filter 1015 and a summer 1019 implement a third notch filter. An analog sampling bandpass filter 1016 and a summer 1020 implement a fourth notch filter. The result is placed on a circuit output 1012. While the comb filter in FIG. 30 uses four notch filters any number (n) of notch filters can be used to produce a comb filter. The resulting comb filter has many adjustable rejection frequencies and relative harmonics.

Figure 31:
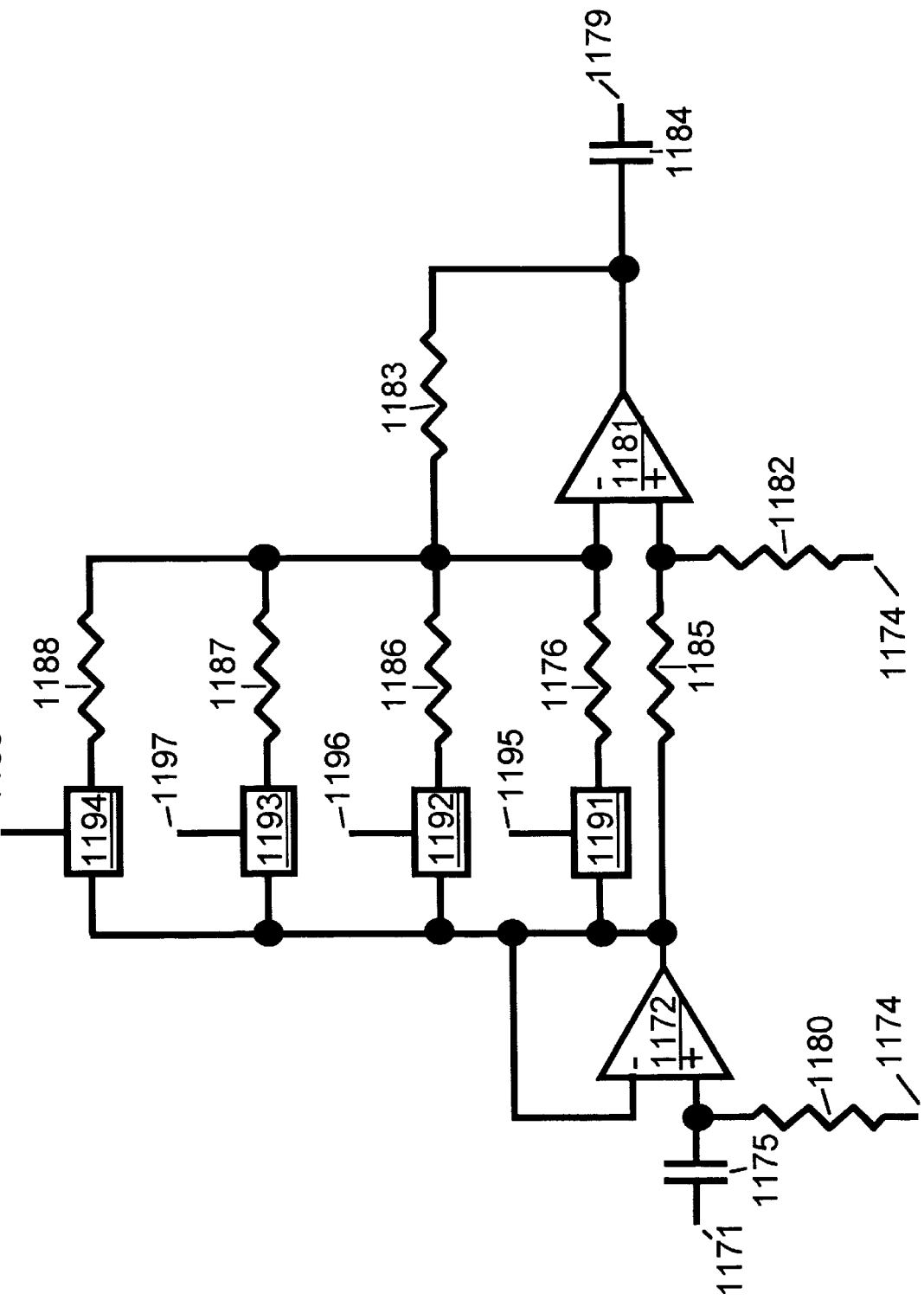
FIG. 31 shows an analog sampling non-inverting comb filter in accordance with a preferred embodiment of the present invention.

FIG. 31, shows an analog sampling non-inverting comb filter. In FIG. 31, an analog sampling bandpass filter 1191, is controlled by a frequency sampling control signal, generated by a sample signal generator circuit such as that shown in FIG. 16, and applied to control signal input 1195. An analog sampling bandpass filter 1192, is controlled by a frequency sampling control signal, generated by a sample signal generator circuit such as that shown in FIG. 16, and applied to control signal input 1196. An analog sampling bandpass filter 1193, is controlled by a frequency sampling control signal, generated by a sample signal generator circuit such as that shown in FIG. 16, and applied to control signal input 1197. An analog sampling bandpass filter 1194, is controlled by a frequency sampling control signal, generated by a sample signal generator circuit such as that shown in FIG. 16, and applied to control signal input 1198.

An operational amplifier 1172 acts as a buffer to receive an input signal on an input 1171. An input capacitor 1175 serves to couple operational amplifier 1172 to input 1171. An operational amplifier 1181 and seven bias resistors 1176, 1186, 1187, 1188, 1182, 1183 and 1185 acts as a unity gain differential amplifier that subtracts the passband at the output of bandpass filters 1191, 1192, 1193 and 1194 from the output signal of amplifier 1172 to produce a comb filter. An output capacitor 1184 serves to couple signals from operational amplifier 1181 to an output 1179. A node 1174 is set at VCC/2. A resistor 1180 is connected between the non-inverting input of operational amplifier 1172 and node 1174. Operational amplifiers 1172 and 1181 have a supply voltage of VCC.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:
1. A filter system comprising:
a first low pass filter comprising:
an input on which is placed an input signal,
an output on which is generated an output signal,
a storage means for providing storage of a signal sample over time, a first end of the storage means coupled to the output,
a switching means, coupled between the first end of the storage means and the input, for, when closed, electrically coupling the input to the first end of the storage means, and for when open electrically isolating the input from the first end of the storage means, and
a control means, for controlling the switching means, the control means generating a switching control signal, the switching control signal having a sampling frequency, wherein a maximum cutoff frequency of the low pass filter is dependent on a value of a capacitance provided by the storage means and a pulse width of the switching control signal;
a first summer circuit that subtracts the output signal on the output of the first low pass filter from the input signal to produce a high pass output signal;
a second low pass filter that receives the high pass output signal and produces a bandpass filtered output; and,
a second summer circuit that subtracts the bandpass filtered output from the input signal to produce a notch filtered output.
2. A filter system as in claim 1 wherein the first summer circuit comprises a differential amplifier.
3. A filter system as in claim 1 wherein the second summer circuit comprises a differential amplifier.
4. A filter system as in claim 1 wherein the control means allows the pulse width of the switching control signal to be reduced so that the maximum cut off frequency of the low pass filter is less than the sampling frequency divided by two.
5. A filter system as in claim 1 wherein the control means allows the pulse width of the switching control signal to be set at a value that allows for a maximum cutoff frequency of the low pass filter to be equal to the sampling frequency divided by two.
6. A filter system as in claim 1 wherein the control means also allows the pulse width of the switching control signal to be set at a value that allows for a maximum cutoff frequency of the low pass filter to be greater than the sampling frequency divided by two.
7. A filter system as in claim 1 wherein the control means allows the pulse width of the switching control signal to be set at a value that allows for signal spikes at harmonics of the sampling frequency to be included in a pass band of the low pass filter.
8. A filter system as in claim 1 wherein the control means varies the pulse width of the switching control signal to change the maximum cut off frequency of the low pass filter.
9. A filter system as in claim 1 additionally comprising:
an additional notch filter receiving the input and producing a second notch filtered output, the second notch filtered output being combined with the first notch filtered output.
10. A filter system as in claim 1 additionally comprising:
additional notch filters, each of the additional notch filters receiving the input and producing an additional notch filtered output which are all combined with the first notch filtered output.

* * * * *